US012672574B2

(12) United States Patent
    Chang

(10) Patent No.: US 12,672,574 B2
(45) Date of Patent: Jun. 30, 2026

(54) BONDING METHOD

(71) Applicant: TAIWAN SEMICONDUCTOR MANUFACTURING COMPANY LTD., Hsinchu (TW)

(72) Inventor: Jen-Yuan Chang, Hsinchu City (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 863 days.

(21) Appl. No.: 17/813,649

(22) Filed: Jul. 20, 2022

(65) Prior Publication Data

US 2024/0030179 A1 Jan. 25, 2024

(51) Int. Cl.
*H10W 72/00* (2026.01)
*H10W 80/00* (2026.01)
*H10W 90/00* (2026.01)

(52) U.S. Cl.
CPC ........ *H10W 72/011* (2026.01); *H10W 80/161* (2026.01); *H10W 80/163* (2026.01); *H10W 80/211* (2026.01); *H10W 80/301* (2026.01); *H10W 80/312* (2026.01); *H10W 80/327* (2026.01); *H10W 80/334* (2026.01); *H10W 90/792* (2026.01)

(58) Field of Classification Search
CPC ......... H01L 24/08; H01L 24/74; H01L 24/80; H01L 2224/80006; H01L 2224/8013; H01L 2224/80145; H01L 2224/8018; H01L 2224/80203; H01L 2224/80896; H01L 2224/80895; H01L 2224/80907
See application file for complete search history.

(56) References Cited

U.S. PATENT DOCUMENTS

| | | | | |
|---|---|---|---|---|
| 4,794,689 | A * | 1/1989 | Seno | H05K 13/082 |
| | | | | 29/743 |
| 6,190,115 | B1 * | 2/2001 | Suzuki | H05K 13/0417 |
| | | | | 414/752.1 |
| 8,769,809 | B2 * | 7/2014 | Masahiro | H05K 13/0413 |
| | | | | 29/832 |
| 9,842,823 | B2 * | 12/2017 | Yu | H01L 24/75 |
| 10,269,611 | B1 * | 4/2019 | Tsai | H01L 21/67057 |
| 10,952,360 | B2 * | 3/2021 | Onishi | H04N 23/57 |
| 11,373,975 | B2 * | 6/2022 | Seyama | H01L 24/75 |
| 2017/0325370 | A1 * | 11/2017 | Nozawa | H05K 13/0413 |

* cited by examiner

*Primary Examiner* — Paul D Kim
(74) *Attorney, Agent, or Firm* — WPAT LAW; Anthony King

(57) ABSTRACT

A method includes configuring a bonding tool based on a first semiconductor die and a second semiconductor die, wherein the bonding tool includes a platform and a first bonding head and a second bonding head connected to the platform; attaching the first semiconductor die to the first bonding head; moving the first semiconductor die toward a semiconductor wafer to bond the first semiconductor die to the semiconductor wafer; releasing the first semiconductor die from the first bonding head; configuring the platform to cause the second bonding head to move the second semiconductor die to the location over the semiconductor wafer while keeping the first bonding head on the platform; and moving the second semiconductor die by the second bonding head toward the semiconductor wafer to bond the second semiconductor die to the semiconductor wafer.

20 Claims, 20 Drawing Sheets

108
104
112C
112A
112B
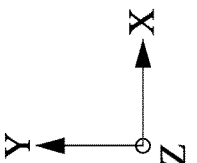
FIG. 1B
10

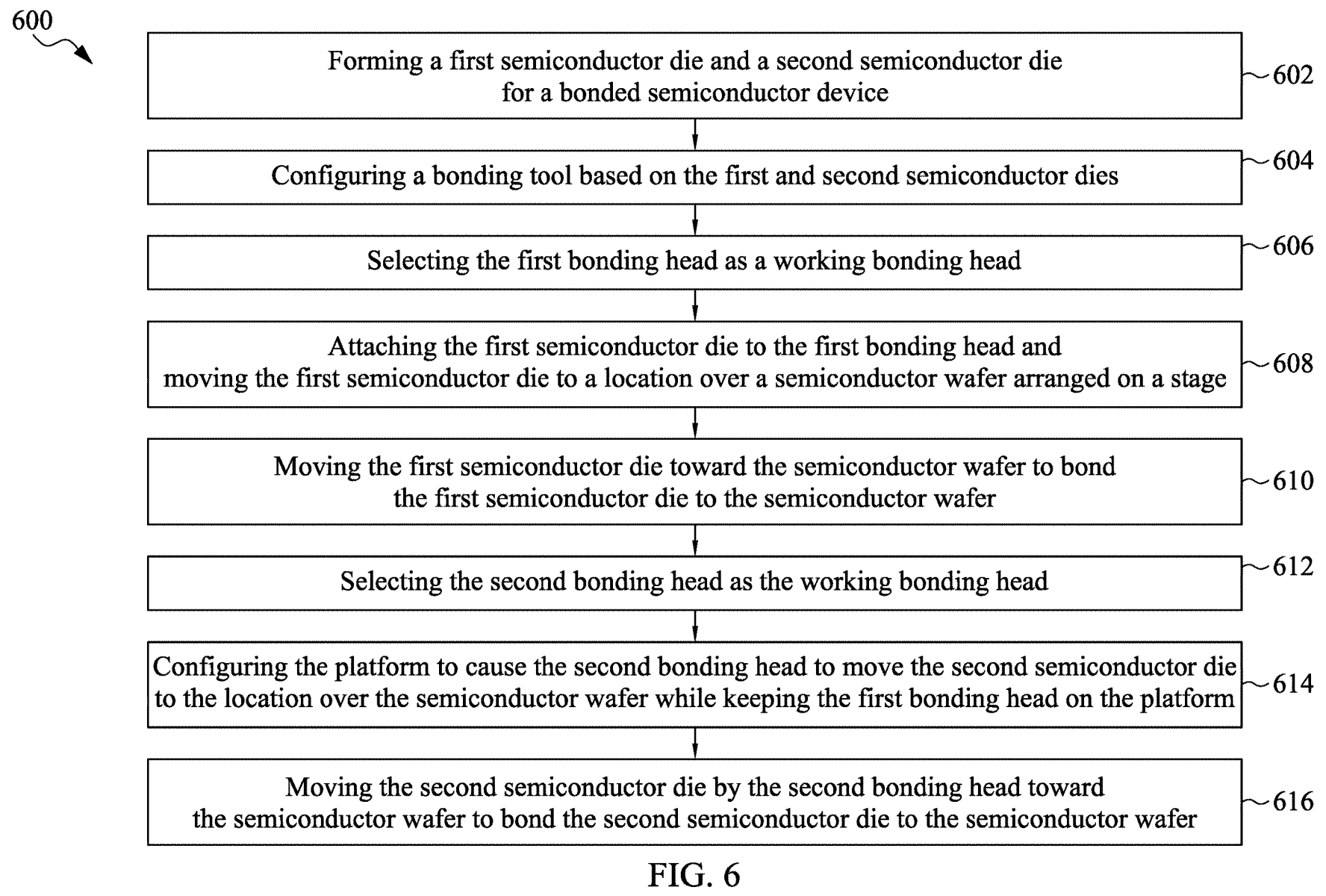

600

Forming a first semiconductor die and a second semiconductor die for a bonded semiconductor device ~602

Configuring a bonding tool based on the first and second semiconductor dies ~604

Selecting the first bonding head as a working bonding head ~606

Attaching the first semiconductor die to the first bonding head and moving the first semiconductor die to a location over a semiconductor wafer arranged on a stage ~608

Moving the first semiconductor die toward the semiconductor wafer to bond the first semiconductor die to the semiconductor wafer ~610

Selecting the second bonding head as the working bonding head ~612

Configuring the platform to cause the second bonding head to move the second semiconductor die to the location over the semiconductor wafer while keeping the first bonding head on the platform ~614

Moving the second semiconductor die by the second bonding head toward the semiconductor wafer to bond the second semiconductor die to the semiconductor wafer ~616

FIG. 6

BONDING METHOD

BACKGROUND

Semiconductor devices are essential for many modern electronic applications. Technological advances in materials and design have prompted progress of the semiconductor devices generation by generation, where each newer generation has smaller and more complex circuits than the previous generation. As semiconductor technologies further advance, stacked semiconductor devices, e.g., three-dimensional integrated circuits (3DIC), have emerged as an effective architecture to reduce the footprint of the semiconductor devices. However, there are still challenges to be addressed in stacking semiconductor devices and reducing manufacturing cost.

BRIEF DESCRIPTION OF THE DRAWINGS

Aspects of the embodiments of the present disclosure are best understood from the following detailed description when read with the accompanying figures. It is noted that, in accordance with the standard practice in the industry, various structures are not drawn to scale. In fact, the dimensions of the various structures may be arbitrarily increased or reduced for clarity of discussion.

FIG. 1B is a plan view of the bonding tool of FIG. 1A, according to aspects of one or more embodiments of the present disclosure.

FIG. 6 is a flowchart of a bonding method, according to aspects of one or more embodiments of the present disclosure.

DETAILED DESCRIPTION

Figure 1A:
FIG. 1A is a schematic diagram of a bonding equipment, according to aspects of one or more embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "upper," "on," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, although the terms such as "first," "second" and "third" describe various elements, components, regions, layers and/or sections, these elements, components, regions, layers and/or sections should not be limited by these terms. These terms may be only used to distinguish one element, component, region, layer or section from another. The terms such as "first," "second" and "third" when used herein do not imply a sequence or order unless clearly indicated by the context.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the deviation normally, found in the respective testing measurements. Also, as used herein, the terms "about," "substantial" or "substantially" generally mean within 10%, 5%, 1% or 0.5% of a given value or range. Alternatively, the terms "about," "substantial" or "substantially" mean within an acceptable standard error of the mean when considered by one of ordinary skill in the art, Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "about," "substantial" or "substantially." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as being from one endpoint to another endpoint or between two endpoints. All ranges disclosed herein are inclusive of the endpoints, unless specified otherwise.

Semiconductor devices have been formed to incorporate more complex functionality with continuing size reduction. Further, in order to manufacture such semiconductor devices with higher efficiency and lower cost, discrete device chips, dies or wafers are bonded and electrically interconnected to form an integrated semiconductor device. A semiconductor package device may be formed accordingly. Among the various semiconductor bonding technologies, die-to-wafer bonding involves attachment and electrical interconnection between one or more dies and a wafer. To further reduce the electrical resistance of the interconnection and the final device size, fusion bonding or hybrid bonding is generally used, where the entire bonding surface of a die facing the bonding surface of the wafer is bonded to the entire bonding surface without any other intervening bonding layers. Therefore, the fusion bonding or hybrid bonding requires a high degree of planarity of the bonding surfaces and stringent alignment requirement between the die and the wafer or between the dies. Moreover, caution should be exercised to ensure complete contact between the two bonding surfaces without undesired gaps or voids left at the interface between the die and wafer or between the dies. If a void or gap is found at the bonding interface of the die and the wafer, a bonding failure may occur. As such, the bonding tool may need to hold the die during bonding while keeping a curved bonding surface of the die to ensure progressive and smooth contact with the wafer from the center to the periphery of the die. As a result, the likelihood of gap or void at the bonding interface can be significantly reduced.

Some embodiments of the present disclosure provide a bonding tool and a bonding method thereof. The proposed method for bonding a plurality of semiconductor dies to a semiconductor wafer is performed using multiple bonding heads corresponding to the semiconductor dies with different die sizes. By deflecting, deforming or bending each semiconductor die by an accurately corresponding bonding head during sucking and bonding the various semiconductor dies, bonding voids and/or bonding gas pockets may be avoided, and the performance of the bonding may be elevated.

FIG. 1A is a schematic diagram of a bonding equipment 10, according to aspects of one or more embodiments of the present disclosure. In some embodiments, the bonding equipment 10 is configured to perform a bonding operation, e.g., hybrid bonding, fusion bonding, or other suitable types of bonding. The bonding equipment 10 is configured to perform a multi-component bonding, where each of the components may be a semiconductor die, a semiconductor chip, a semiconductor wafer, or the like, collectively referred to herein as a workpiece of the bonding operation. The bonding equipment 10 generally includes one or more chambers, in which the one or more chambers is configured to accommodate a bonding tool 100 and a wafer stage 200. In some embodiments, the wafer stage 200 is configured to hold or support a semiconductor wafer 202, and the bonding tool 100 is configured to hold a semiconductor die 204, in which the semiconductor die 204 is to be bonded to the semiconductor wafer 202 during a bonding operation. In some embodiments, the semiconductor wafer 202 includes a plurality of semiconductor devices (see exemplary semiconductor devices 504A, 504B illustrated in FIG. 5A) arranged in an array and formed on an upper surface of the semiconductor wafer 202. In some embodiments, each semiconductor device has a bonding surface 202S and the semiconductor die 204 has a bonding surface 204S, wherein the bonding surfaces 202S and 204S face each other. In some embodiments, the area of the bonding surface 202S is greater than the area of the bonding surface 204S. In some embodiments, after the bonding operation is completed throughout all of the semiconductor devices of the semiconductor wafer 202, a dicing operation is performed on the semiconductor wafer 202 to separate the semiconductor devices into individual dies.

The bonding tool 100 includes an arm 102, a shaft 104, a connecting member 106, a platform 108 and a plurality of bonding heads 112. The arm 102 may be a robot connected to the shaft 104 and configured to move the bonding heads 112 between different chambers (not separately shown) of the bonding equipment 10 through the shaft 104, the connecting member 106 and the platform 108. The semiconductor die 204 may be picked by the bonding head 112 through the movement of the arm 102 from a die carrier arranged in one chamber to another chamber where the wafer stage 200 is arranged. In some embodiments, the arm 102 is configured to align the semiconductor die 204 with the semiconductor wafer 202 in a coarse alignment operation.

In some embodiments, the shaft 104 is connected to the arm 102 and supports the connecting member 106. The shaft 104 may extend in a vertical direction and may include retractable parts to facilitate movement of the bonding heads 112 in the vertical direction. In some embodiments, the platform 108 is connected to the shaft 104 through the connecting member 106. The platform 108 may be rotatably attached to the connecting member 106. In some embodiments, the platform 108 is a turntable, a revolving nosepiece, or the like, and has a shape of a plate, a disk, a platter, a cylinder, a prism, or the like. In some embodiments, the connecting member 106 has a shape of wedge from a cross-sectional view so that the platform 108 rotates about a longitudinal axis non-parallel to a longitudinal axis of the shaft 104. In some embodiments, the connecting member 106 is integrated into the shaft 104. In some embodiments, the bonding tool 100 does not include the connecting member 106 and the longitudinal axis of the platform 108 is parallel to the longitudinal axis of the shaft 104.

In some embodiments, the bonding tool 100 includes a driving device 124 and a linkage device 126, The driving device 124 may be arranged in the shaft 104 or the connecting member 106 and configured to rotate the platform 108. The driving device 124 is configured to provide driving power to the linkage device 126 and may be a motor, e.g., an electric motor, a magnetic motor, a pneumatic motor, or the like. The linkage device 126 may be arranged in the shaft, configured to rotate the platform 108 and formed of a chain, a belt, a gas pipe, a gear, a combination thereof, or the like. In some embodiments, the bonding tool 100 further includes a track device 132 connecting the platform 108 and the connecting member 106 and configured to rotate the platform 108 about the longitudinal axis of the platform 108. The track device 132 may be a roller, a rotating track, or the like, and may include a bearing 134 to reduce rotational friction of the platform 108. The bonding tool 100 may further include a shaft or a bar 122 connected to the track device 132 and extending in the direction of the longitudinal axis of the platform 108, in which the shaft 122 is rotated along with the track device 132 to facilitate rotation.

In some embodiments, the bonding tool 100 further includes one or more fasteners 136 configured to secure the platform 108 at the desired rotation angle. The fastener 136 may include a clamp, a screw, a bolt, a shaft, a stud, a magnetic device, or the like, formed on one of the connecting member 106 and the platform 108. In some embodiments, the bonding tool 100 includes a pair of fasteners 136 arranged on corresponding locations of the connecting member 106 and the platform 108.

In some embodiments, the bonding tool 100 further includes one or more alignment devices 138 arranged on corresponding locations of the connecting member 106 and the platform 108. The alignment device 138 may be an optical device configured to perform alignment between the platform 108 and the connecting member 106. In some embodiments, an alignment mark is formed on one of the platform 108 and the connecting member 106 for alignment conducted by the alignment device 138 arranged on the other one of the platform 108 and the connecting member 106. In some embodiments, the fasteners 136 are configured to fasten the platform 108 to the connecting member 106 at the desired angle after the alignment of the platform 108 is completed by the alignment device 138.

In some embodiments, the bonding tool 100 further includes one or more alignment devices 140 arranged on the shaft 104 or the arm 102. The alignment device 140 may be an optical device configured to perform alignment between the bonding tool 100 and the wafer stage 200. In some embodiments, one or more alignment marks are formed on the semiconductor wafer 202 for alignment conducted by the optical device arranged on the alignment device 140. In some embodiments, the arm 102 is configured to move in the horizontal direction and stop at the desired location after the alignment of the bonding tool 100 is completed by the alignment device 140.

In some embodiments, the bonding tool 100 includes a pumping device 142 arranged in the shaft 104 or the arm 102 and configured to apply suction force to the bonding heads 112 for sucking and securing the semiconductor die 204 to the bottom surface of the bonding heads 112. In some embodiments, the bonding tool 100 includes air channels (not separately shown) between the pumping device 142 and the bonding heads 112 to draw air and form a vacuum space around the surface of the bonding head 112 and the semiconductor die 204. In some embodiments, the pumping device 142 includes an air pump, e.g., an air compressor, a diaphragm pump, or other suitable pumps.

In some embodiments, the bonding tool 100 further includes a processor 144 configured to control the aforesaid components of the bonding tool 100 during a bonding operation. In some embodiments, the processor 144 includes e.g., a microprocessor, a microcontroller, or the like, and is configured to move the arm 102, the shaft 104, or to rotate the platform 108 through controlling the driving device 124 and the linkage device 126. In some embodiments, the processor 144 is configured to control calibration and alignment between the platform 108 and the connecting member 106, between the platform 108 and the bonding heads 112 and between the bonding head 100 and the wafer stage 200.

In some embodiments, the bonding heads 112, e.g., bonding heads 112A, 112B, 112C, are detachably fastened to the platform 108. In some embodiments, the platform 108 includes multiple sockets for installation of the bonding heads 112. The bonding heads 112 each may have different suction configurations with different suction capabilities suitable for sucking the semiconductor dies 204 with different sizes. As such, the bonding head 112 can also be referred to as a suction head of the bonding tool 100. During operation, the platform 108 is rotated so as to select one of the bonding heads 112 as the working bonding head to face the wafer stage 200, FIG. 1B is a plan view of a bonding tool taken from a section line of FIG. 1A, according to aspects of one or more embodiments of the present disclosure. As shown in FIG. 1B, the selected bonding head 112 (e.g., the bonding head 112A in the depicted embodiment) serving as the working bonding head is moved to a location directly below the shaft 104 through rotation of the platform 108. The shaft 104 may completely overlap or cover the working bonding head 112 from a top-view perspective. Other bonding heads that are not selected for the current bonding step are referred to as idle bonding heads, and may be selected as the working bonding head in subsequent bonding steps for bonding other semiconductor dies during the formation of the same bonded semiconductor device. In some embodiments, the longitudinal axis of the selected bonding head 112 is overlapped or separated from the longitudinal axis of the shaft 104. In some embodiments, the selected bonding head 112 has a longitudinal axis parallel to the longitudinal axis of the shaft 104 from a top-view perspective. In some embodiments, the bonding heads 112 are fastened to the platform 108 through one or more fasteners (not separately shown) to fasten the bonding heads 112 to the platform 108. The fasteners may include a clamp, a screw, a bolt, a shaft, a stud, a magnetic device, or the like, formed on the bonding head 112 or the platform 108. In some embodiments, the bonding tool 100 includes a pair of fasteners arranged on corresponding locations of the platform 108 and each of the bonding heads 112.

In some embodiments, the bonding heads 112 are replaced by other types of bonding heads with different configurations based on the types and sizes of the semiconductor dies 204 to be bonded before the bonding operation is performed. In the depicted example, the bonding tool 100 includes a three-head platform 108. However, other numbers of the bonding heads 112 greater than one, e.g., a two-head platform, a four-head platform, or the like, are also possible and are within the contemplated scope of the present disclosure.

Figure 2A:
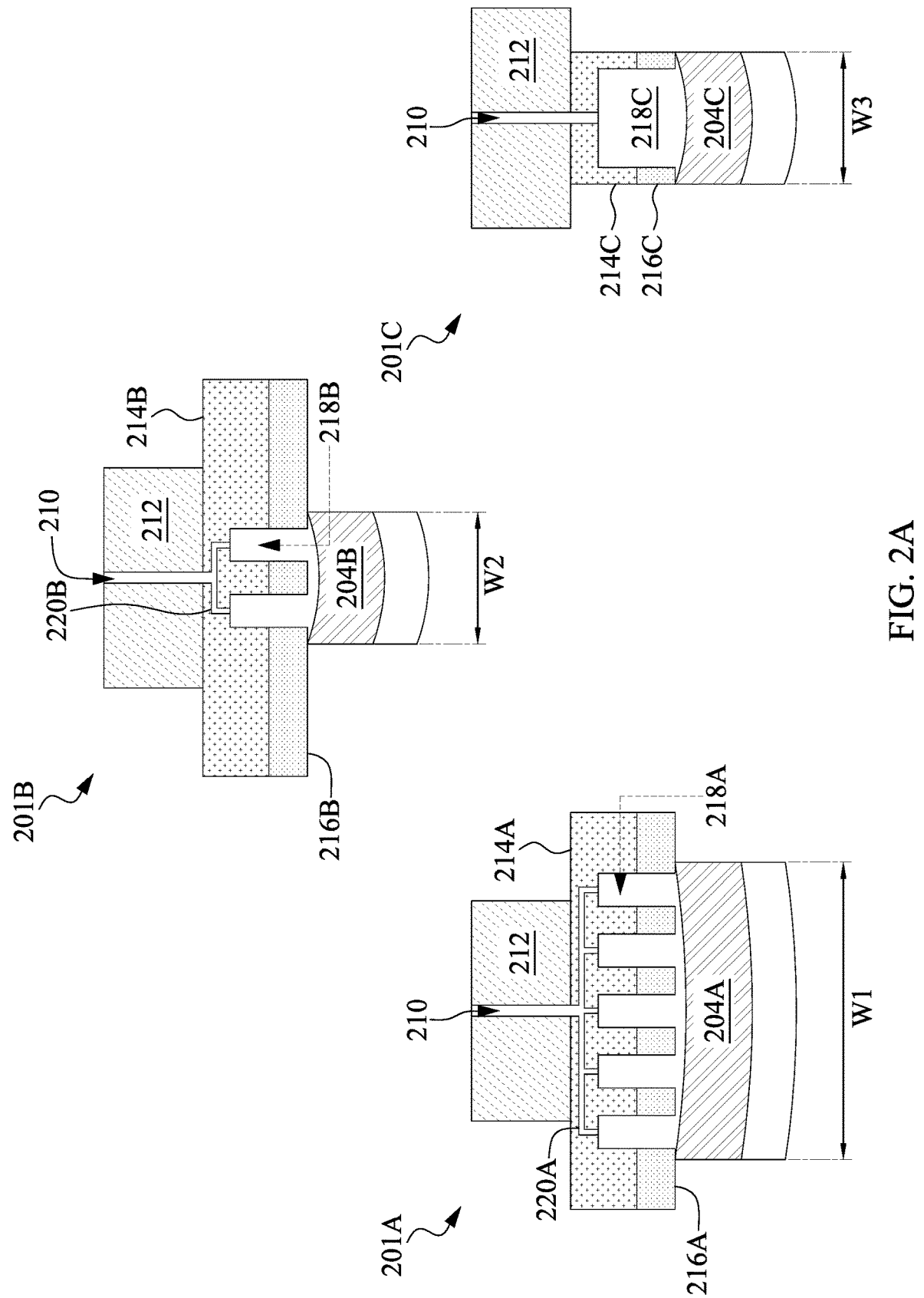
FIGS. 2A and 2B are schematic cross-sectional views of various bonding heads, according to aspects of one or more embodiments of the present disclosure.

FIG. 2A shows schematic cross-sectional views of various bonding heads 201A, 201B, 201C, according to aspects of one or more embodiments of the present disclosure. FIG. 2A shows three exemplary bonding heads 201A to 201C with different configurations, and each of the bonding heads 112A, 112B, 1120 can be formed according to one of the bonding heads 201A to 201C. Each of the bonding heads 201 is selected according to the types, e.g., shapes and sizes, of the semiconductor dies 204 that will be bonded during the bonding operation. Although FIG. 2A illustrates only three configurations of the bonding head 201, the present disclosure is not limited thereto and can include more of bonding head configurations with different suction capabilities.

The bonding heads 201A to 201C each have a body 212, a chuck 214 and a heating plate 216. The body 212 is connected to the chuck 214 and holds the chuck 214. In some embodiments, the body 212 has a circular shape or a polygonal shape from a top-view perspective. Each of the sockets of the platform 108 and the body 212 may be of the same size for the various bonding heads 201A to 201C for ease of installation compatibility. The chuck 214 is configured to engage, hold or clamp the semiconductor die 204 so as to keep the semiconductor die 204 in place during the suction and bonding operations. In some embodiments, the chuck 214 is configured to apply a sucking force to the semiconductor die 204. In some embodiments, the chuck 214 is a vacuum chuck providing a vacuum force to hold the semiconductor die 204. The chuck 214 may include one or more vacuum holes 218 for providing suction force. The body 212 may include an air channel 210 extending through the body 212 and one or more air sub-channels 220 extending between the body 212 and the vacuum holes 218 to pump air from the vacuum holes 218 to the pumping device 142 of the bonding tool 100.

The heating plate 216 is attached to a lower surface of the corresponding chuck 214. During operation, after the semiconductor die 204 is attached to the underlying semiconductor wafer 202 or another semiconductor die, the bonding tool 100 continues to exert a downward bonding force on the bonded semiconductor device. In some embodiments, a thermal operation is performed on the bonded semiconductor device to facilitate formation of chemical bonds at the bonding surface formed of, e.g., oxide or conductive materials. The heating plate 216 is configured to convey heat to the semiconductor die 204 when the engaged semiconductor dies 204 and semiconductor wafer 202 achieve full bonding. The heating plate 216 may be formed of a metallic material, or other suitable materials.

In some embodiments, the suction forces exerted through the vacuum holes 218 are designed in adaptation to the size and shape of the semiconductor die 204 such that the semiconductor die 204 can be bent in a concave upward manner, i.e., a central region of the semiconductor die 204 is lower than an peripheral region of the semiconductor die 204. During a bonding operation of the semiconductor die 204 with the underlying semiconductor wafer 202 or another semiconductor die, the semiconductor die 204 is moved downward to approach the semiconductor wafer 202, and a lowest point of the central region of the semiconductor die 204 engages the semiconductor wafer 202 earlier than the remaining portions of the semiconductor die 204. The contact area extends progressively from the central region to the peripheral region, and therefore the likelihood of gap or void at the interface between the semiconductor die 204 and the semiconductor wafer 202 can be reduced.

Based on the above design principle, the configurations of the vacuum holes 218A, 218B and 218C for the respective bonding heads 201A, 201B, 201C are different from each other, e.g., the vacuum hole numbers, the vacuum hole widths, the vacuum hole pitchs, and the like, according to the sizes and shapes of their corresponding semiconductor dies 204A, 204B, 204C. For example, the width W1 of the semiconductor die 204A is in a range between lengths R1 and R2, the width W2 of the semiconductor die 204B is in a range between lengths R2 and R3, and the width W3 of the semiconductor die 204C is in a range less than the length R3, where R3<R2<R1. Therefore, the number of the vacuum holes 218A is different from, e.g., greater than, the number of the vacuum holes 218B or 218C to provide a greater vacuum force to the semiconductor die 204A than the vacuum force to the semiconductor die 204B in an attempt to successfully secure the semiconductor dies 204A, 204B while keeping desired curvatures or bending shapes of both of the semiconductor dies 204A and 204B during suction. Similarly, the number of the vacuum holes 218B is different from, e.g., greater than, the number of the vacuum holes 218C to provide a greater vacuum force to the semiconductor die 204B than the vacuum force to the semiconductor die 204C in an attempt to successfully secure the semiconductor die 204C while keeping a desired curvature of the semiconductor die 204C.

The locations of the vacuum holes 218 are determined to be covered by the semiconductor die 204 to provide better suction performance, and therefore the numbers and locations of the vacuum holes 218 should adapt to the side and shape of the semiconductor die 204. In some embodiments, the vacuum holes 218A have different sizes, densities or pitches in the central region and the peripheral region of the bonding head 201A, For example, referring to the bonding head 201A, the vacuum holes 218A are classified into a first group, a second group and a third group, where the first group is arranged around the central region of the chuck 214A, the third group around the peripheral region of the chuck 214A, and the second group between the first group and the third group. In some embodiment, the average vacuum forces exerted through the different groups are the same or different from each other. In some embodiments, the first group may have a greater hole width, from a cross-sectional view, than the hole width of the second group for providing less suction pressure given the same pumping power provided by the pumping device 142. This may help the semiconductor die 204 to keep the concave upward shape. Likewise, the second group may have a greater hole width, from a cross-sectional view, than the hole width of the third group for providing less suction pressure given the same pumping power provided by the pumping device 142. In some embodiments, the bonding head 201A only include the second group and the third group of vacuum holes 218A and does not arrange any vacuum hole around the central region of the chuck 214A.

In some embodiments, the first group may have a hole pitch greater than the hole pitch of the second or third group for providing less suction pressure given the same pumping power provided by the pumping device 142. This may help the semiconductor die 204A to keep the concave upward shape. Likewise, in some embodiments, the second group may have a hole pitch, from a cross-sectional view, greater than the hole pitch of the third group for providing less suction pressure given the same pumping power provided by the pumping device 142.

Referring to the bonding heads 201B and 201C, since the semiconductor dies 204B, 204C have less area than the semiconductor die 204A, the chuck 214B is configured with less (e.g., two) vacuum holes 218B, and the chuck 214C is configured with a single vacuum hole 218C. In some embodiments, the vacuum holes 218A, 218B, 218C are symmetrical with respect to a central vertical axis of the bonding head 112, regardless of the number of the vacuum holes 218.

Figure 2B:
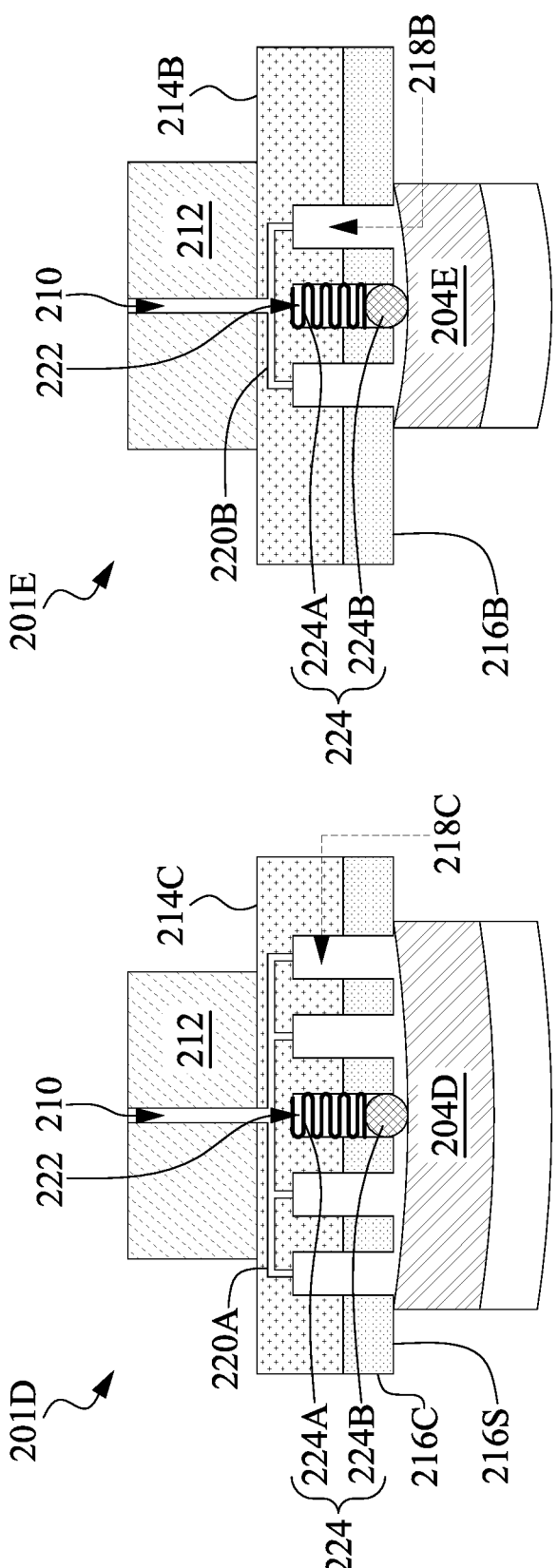

FIG. 2B shows schematic cross-sectional views of various bonding heads 201D and 201E, according to aspects of one or more embodiments of the present disclosure. FIG. 2B shows two exemplary bonding heads 201D, 201E with different configurations, and each of the bonding heads 112A, 112B, 1120 can be formed according to one of the bonding heads 201D, 201E. Each of the bonding heads 201D, 201E is selected according to their types, e.g., shapes, areas and sizes, of the semiconductor dies 204 that will be bonded during the bonding operation. Although FIG. 2B illustrates only two configurations of the bonding head 201, the present disclosure is not limited thereto and can include more bonding head configurations.

Referring to the bonding heads 201D and 201E, the chuck 214 further includes a trench 222 and a bending member 224 arranged in the trench 222. In some embodiments, the bending member 224 has a fixed end connected to the trench 222 and a free end protruding from the trench 222. The bending member 224 may be movably arranged in the trench 222. In some embodiments, the bending member 224 is configured to exert a bending force upon the semiconductor die 204. In some embodiments, the bending member 224 protrudes from the lower surface 216S of the heating plate 216 when no semiconductor die is sucked to the bonding head 112. The lower surface 216S may have a central region and a peripheral region laterally surrounding the central region. In some embodiments, the trench 222 is located at the central region of the lower surface 216S. As a result, the bending member 224 is disposed in the central region of the lower surface 216S for bending the semiconductor die 204 from the central point thereof. In some embodiments, the vacuum holes 218 are disposed in the peripheral region of the chuck 214 or the heating plate 216. In some some embodiments, the vacuum holes 218 laterally surround the bending member 224.

In some embodiments, the bending member 224 is also be referred to as a bend-inducing member configured to bend the semiconductor die 204. The bending member 224 may include a spring 224A and a body 224B connected to the spring 224A. In some embodiments, the body 224B is in a shape of sphere, semi-sphere, cylinder, cobblestone, prism, or the like. The spring 224A may be used to push the body 224B out of the trench 222, and stop the body 224B moving upward through contraction or compression of the spring 224A when the bending member 224 is pressed upward. In some embodiments, the spring 224A is a coil spring. In alternative embodiments, the spring 224A includes spring steel, sponge, cushion, or the like. In some other embodiments, the bending member 224 is formed of an elastic block arranged in the trench 222. The bending member 224 may include a cushion device made of elastic materials.

In some embodiments, the body 224B is movably arranged in the trench 222. For example, when the bending member 224 is in its normal position (unstrained position), the body 224B protrudes from the lower surface 216S. When the bending member 224 is in its retracted position, a lowest point of the body 224B is substantially level with or lower than the lower surface 216S. The introduction of the bending member 224 may aid in flexibly pushing the central region of the semiconductor die 204 outward to form the bent surface, and retracting to the interior of the trench 222 after the semiconductor die 204 has been bonded and become flat. The bonding performance can be improved accordingly.

Figure 2C:
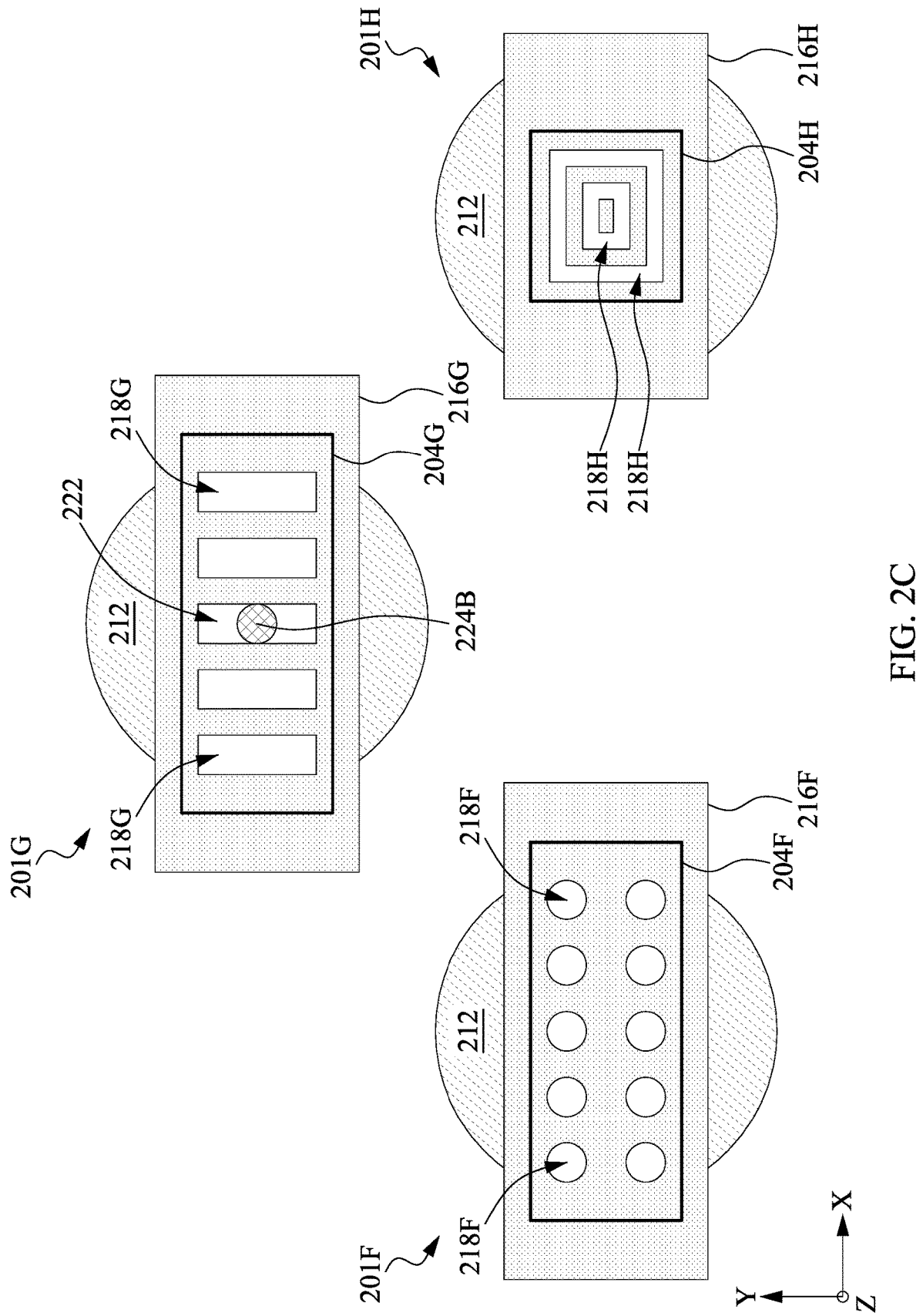
FIG. 2C shows schematic bottom views of various bonding heads, according to aspects of one or more embodiments of the present disclosure.

FIG. 2C shows schematic bottom views of various bonding heads 201F, 201G, 201H, according to aspects of one or more embodiments of the present disclosure. FIG. 2C shows three exemplary bonding heads 201F to 201H with different configurations, and each of the bonding heads 112A, 112B, 1120 can be formed according to one of the bonding heads 201F to 201H.

Referring to the bonding head 201F, the vacuum holes 218F are uniformly spaced within the coverage of the semiconductor die 204F. Each of the vacuum holes 218 may have a circular shape, a square shape, a polygonal shape or other suitable shapes. In some embodiments, the vacuum holes 218F are formed in one row, one column, or an array. The depicted embodiment illustrates the vacuum holes 218F with an array of five columns and two rows. In some embodiments, the vacuum holes 218F at the outer regions of the array form a profile following the circumference, e.g., a rectangular shape, of the semiconductor die 204F. Alternatively, multiple vacuum holes 218F may be arranged in a circular profile in adaptation to a circular-shaped semiconductor die 204F. As discussed previously, the vacuum holes 218 may have different pitch or widths (or equivalently areas) from a bottom-view perspective to generate a desired suction force distribution that can keep the semiconductor die 204F with a curved shape. For example, the vacuum holes 218F in the central column of the array has a hole diameter or a width greater than that of the vacuum holes 218F in the other columns. Alternatively, the hole diameters or widths of the vacuum holes 218E are made progressively less from the central column to the peripheral column. In some embodiments, the semiconductor die 204F has a long side parallel to the X-axis and a short side parallel to the Y-axis. The vacuum holes 218F in the same row may have different configurations to generate the curved shape of the semiconductor die 204F along the long side. In some embodiments, the vacuum holes 218F in the short side (e.g., the side extending in the Y-axis) in the same column have substantially the same configuration to ensure a uniform suction performance across the short side.

The bonding head 201G includes vacuum holes 218G extending in the Y-axis and parallel to each other. In some embodiments, the vacuum holes 218G are in a shape of a rectangle, a bar, a strip, or the like. The vacuum holes 218G are uniformly spaced within the coverage of the semiconductor die 204G. In some embodiments, a trench 222 is arranged at the center of the surface 216S among the vacuum holes 218G. The body 224B of the bending member 224 is arranged within the trench 222. In some embodiments, the body 224B is circular or rectangular from a bottom-view perspective.

Referring to the bonding head 20111, the vacuum holes 218H are arranged extending in both the X-axis and the Y-axis, e.g., in a ring shape from a bottom-view perspective. In some embodiments, multiple vacuum holes 218G are arranged in a concentric manner. The sides of the vacuum holes 218G may be parallel to the sides of the semiconductor die 204H.

Although the vacuum holes 218F, 218G, 218H are arranged with different configurations, they can be combined in any manner in any one of the bonding heads 112 of the bonding tool 100. In some embodiments, the bending member 224 as shown in the bonding head 201B or 201E is optional and removed from the bonding head 112.

Figure 3A:
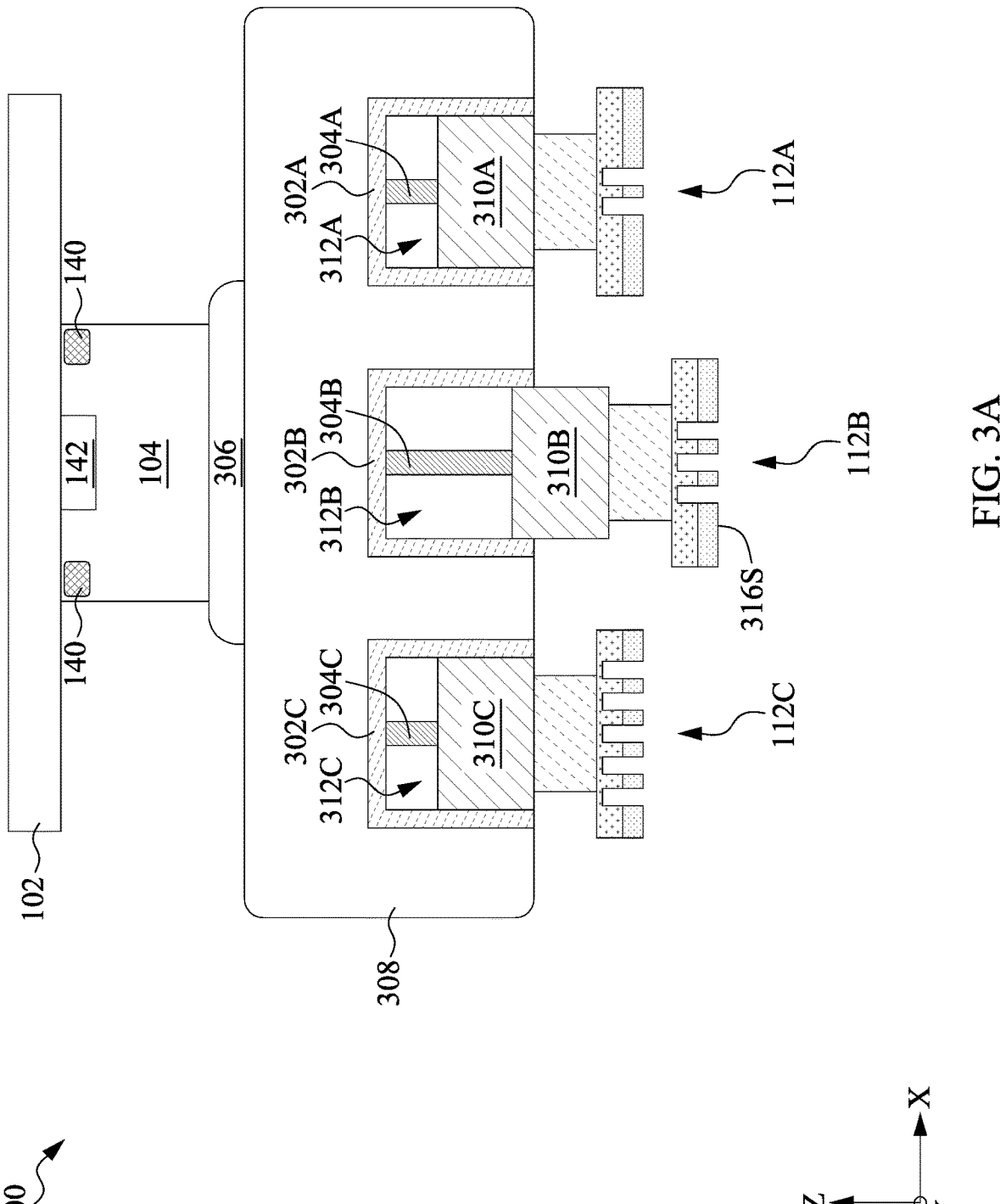
FIG. 3A is a schematic diagram of a bonding tool, according to aspects of one or more embodiments of the present disclosure.

FIG. 3A is a schematic diagram of a bonding tool 300, according to aspects of one or more embodiments of the present disclosure. The bonding tool 300 is similar to the bonding tool 100 in many aspects, and descriptions of these similar features are omitted for simplicity. The bonding tool 300 is different from the bonding tool 100 in that the bonding tool 300 includes a connecting member 306 and a platform 308 connected to the connected member 306. Unlike the connecting member 106, the connecting member 306 may has substantially uniform thicknesses across the horizontal direction such that the vertical axis of the platform 308 is substantially parallel to the vertical axes of the shaft 104 and the connecting member 306.

In some embodiments, the platform 308 includes a turntable configured to rotate about the vertical axis of the platform 308. The bonding tool 300 may include one or more driving components (not separately shown) similar to those discussed with reference to FIG. 1A, e.g., the driving device 124, the linkage device 126, the track device 132, the bearing 134, and the like, for driving the platform 308 to rotate about the central axis of the platform 308. In some embodiments, the bonding tool 300 includes one or more alignment and calibration components (not separately shown) similar to those discussed with reference to FIG. 1A, e.g., the fasteners 136, the alignment devices 138, 140, and the like.

In some embodiments, unlike the bonding tool 100, in which the individual bonding heads 112 are moved to different vertical levels during rotation of the platform 108, the platform 308 rotates horizontally such that each of the bonding heads 112 are moved at substantially the same vertical level during rotation of the platform 308. The platform 308 includes multiple frames 302 defining sockets 312 in the platform 308. In some embodiments, the platform 308 further includes lifting devices 304 in the respective sockets 312 for connecting bonding heads 112 to the corresponding frames 302. In some embodiments, the lifting devices 304 are configured to lift the bonding heads 112 in a vertical direction, e.g., moving the bonding heads 112 upward or downward. The lifting device 304 may include a driving assembly, e.g., a clamping device 310 for holding the bonding head 112, a motor for providing power, and a linkage device connecting the clamping device 310 to the lifting device 304, where the linkage device may be a shaft, a screw, a telescopic rod, or the like. Although not shown, the bonding tool 300 may include an air channel, and the bonding heads 112 may include air sub-channels to draw air around the lower surface 216S of the bonding head 112 to the pumping device 142 through the air channel.

Before the bonding operation begins, all of the bonding heads 112 are retracted to be close to the platform 308. In some embodiments, an entirety of part of the clamping devices 310 is moved into the interior of the sockets 312. During the bonding operation, when one of the bonding heads 112 is selected, e.g., the bonding head 112B is selected as the working bonding head, the lifting device 304B moves the bonding head 112B downward such that a lower surface 316S of the working bonding head 112B is lower than the lower surfaces of other idle bonding heads 112. In some embodiments, the lower surface 316S is lower than the lower surfaces of the idle bonding heads 112 by at least, e.g., 0.5 cm to 2 cm to ensure the idle bonding heads 112 will not interfere with the bonding performance of the working bonding head 112B.

Figure 3B:
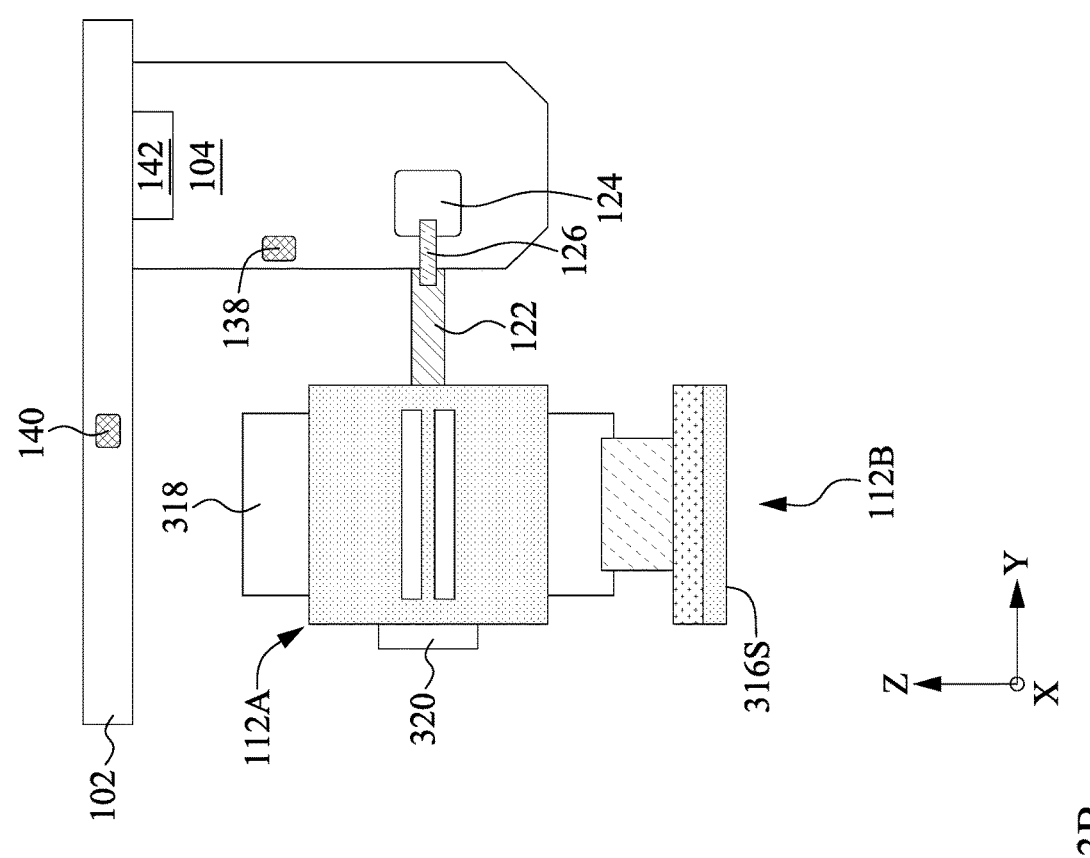
FIG. 3B shows a front view and a side view of a bonding tool, according to aspects of one or more embodiments of the present disclosure.
Figure 3B:
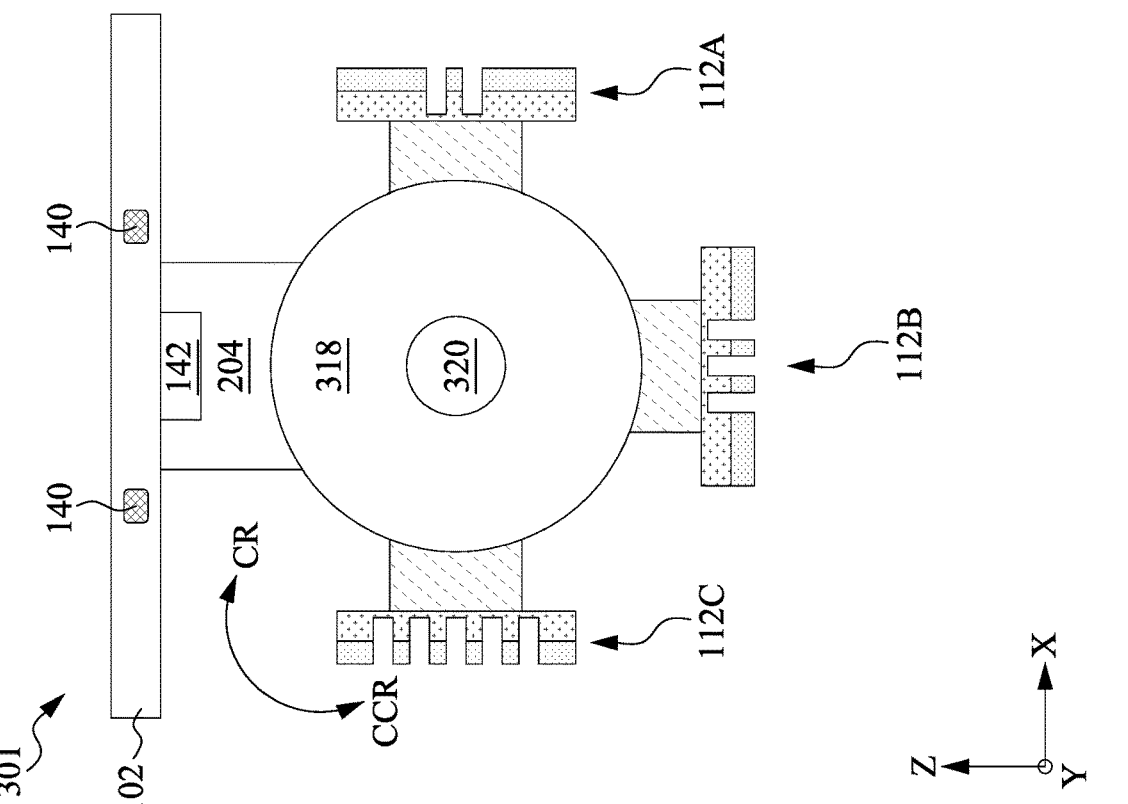

FIG. 3B shows a front view and a side view of a bonding tool 301, according to aspects of one or more embodiments of the present disclosure. The bonding tool 301 is similar to the bonding tool 100 or 300 in many aspects, and descriptions of these similar features are omitted for simplicity. Although not shown, the bonding tool 301 the bonding heads 112 may include an air channel and air sub-channels, respectively, to draw air around the lower surface of the bonding head 112 to the pumping device 142. The bonding tool 301 is different from the bonding tool 100 or 300 in that the bonding tool 301 includes a platform 318 connected to the shaft 104 via a shaft 122 extending in the horizontal direction, e.g., the Y-axis, perpendicular to the direction in which the shaft 104 extends. The bonding tool 301 may further includes a fixing member 320 arranged on one end of the shaft 122 and used for fixing the platform 318 on the shaft 122.

In some embodiments, the platform 318 has a circular shape and is spaced apart from the shaft 104 to rotate freely according to a bonding command. The surface of the platform 318 may be extending in the XZ plane. In some embodiments, the platform 318 is a turntable configured to rotate in the XI-plane about the axis of the shaft 122.

The bonding heads 112 are detachably connected to the rim of the platform 318. In some embodiments, similar to the bonding tool 100, the individual bonding heads 112 are rotated to different levels during rotation of the platform 318. In some embodiments, the platform 318 are configured to lift the bonding heads 112 upward or move the bonding heads 112 downward such that the bonding surface 316S of the working bonding head 112B is lower than the lowest point of any idle bonding heads 112. In some embodiments, the lower surface 316S is lower than the lowest point of the idle bonding heads 112 by, e.g., at least 0.5 cm to 2 cm to ensure that the idle bonding heads 112 will not interfere with the bonding performance of the working bonding head 112B.

FIGS. 4A to 4G are schematic diagrams of intermediate stages of a bonding method, according to aspects of one or more embodiments of the present disclosure. It shall be understood that additional steps can be provided before, during, and after the steps shown in FIGS. 4A to 4G, and some of the steps described below can be replaced with other embodiments or eliminated. The order of the steps may be interchangeable. Some of the steps may be performed concurrently or independently. In some embodiments, the bonding method illustrated in FIGS. 4A to 4G is referred to herein as a pick-and-place (PnP) bonding method.

Figure 4A:
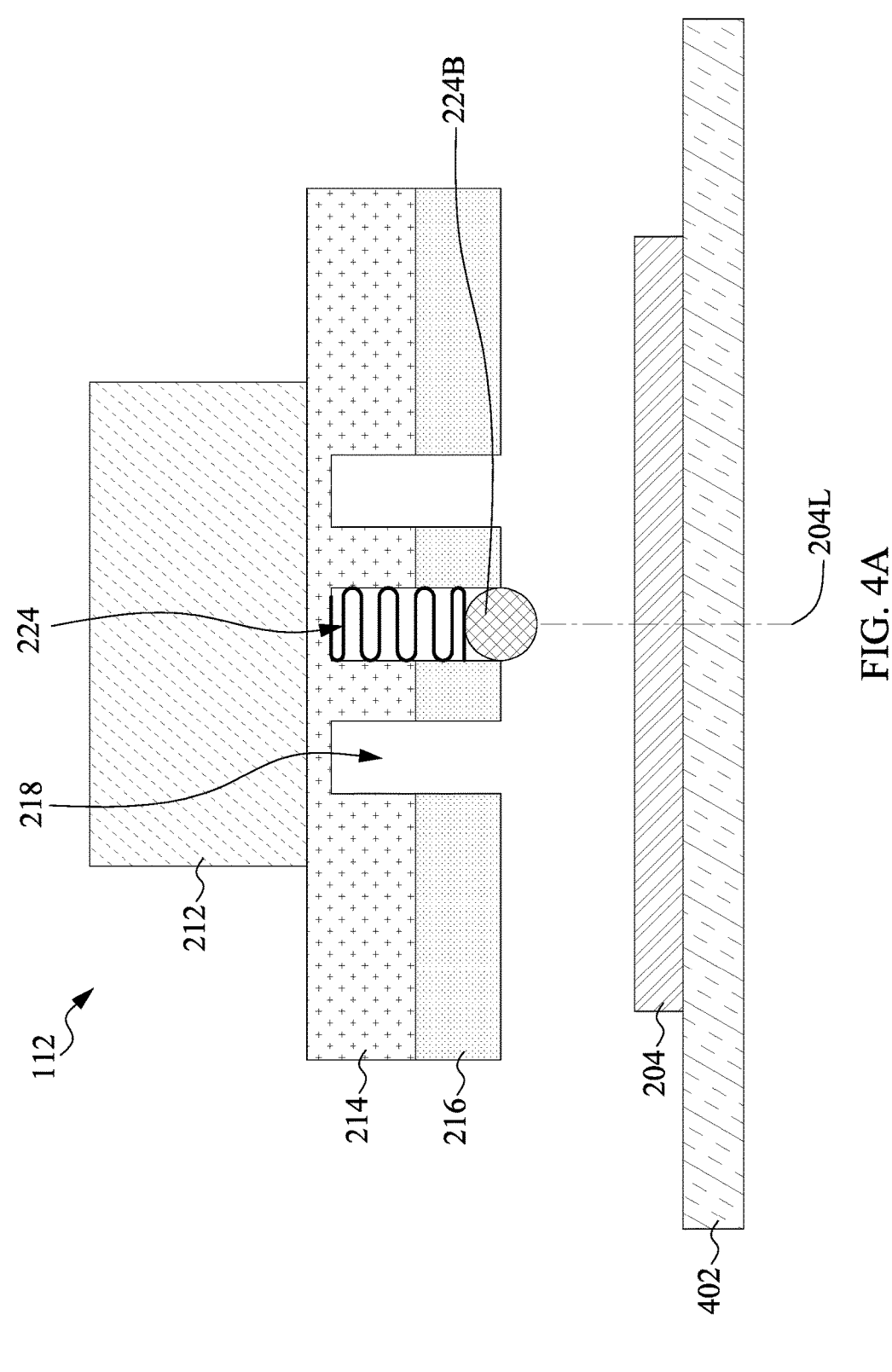
FIGS. 4A to 4G are schematic diagrams of intermediate stages of a bonding method, according to aspects of one or more embodiments of the present disclosure.

Referring to FIG. 4A, a die carrier 402 is arranged in a first bonding chamber 410. The die carrier 402 may include one or more semiconductor dies, including the exemplary semiconductor die 204, on a surface of the die carrier 402. The semiconductor dies 204 may be arranged in rows, columns or an array. The semiconductor die 204 may be a logic die, a sensor die, a memory die, a system-on-chip (SOC) die, an application specific integrated circuit (ASIC) die, or the like. The semiconductor die 204 may be formed using any acceptable process.

In some embodiments, the bonding head 112 is aligned with the semiconductor die 204 with help of an alignment device (e.g., the alignment device 140). In some embodiments, the semiconductor die 204 is arranged with a long side extending across the multiple vacuum holes 218 from a cross-sectional view. The vacuum holes 218 may be symmetrical with respect to the central line 204L of the semiconductor die 204 in order to provide symmetrical suction forces to the semiconductor die 204 along the long side of the semiconductor die 204. In some embodiments, the bending member 224 or the body 224B of the bending member 224 overlaps the central line 204L. After the alignment is completed, the bonding head 112 is moved down to approach the semiconductor die 204. As discussed previously, the bonding head 112 includes vacuum holes overlapping the surface of the semiconductor die 204 from a top-view perspective. In some embodiments, the bonding head 112 includes a bending member 224, where the body 224B extending beyond the lower surface of the bonding head 112.

Figure 4B:

Referring to FIG. 4B, the bonding tool 100 is moved down to contact the semiconductor die 204. The semiconductor die 204 is picked and secured by the bonding head 112 from the upper surface of the semiconductor die 204. In some embodiments, a suction force, provided by the pumping device 142, is exerted on the semiconductor die 204 through the vacuum holes 218, and therefore the semiconductor die 204 is attached to the heating plate 216 in at least a peripheral region of the semiconductor die 204. In some embodiments, different suction forces or pressures are applied to different regions of the semiconductor die 204. In some embodiments, the bending member 224 bends the semiconductor die 204 even when the suction forces are substantially equal in the central region and the peripheral region of the semiconductor die 204. In some embodiments, a die ejector 404 is arranged on a backside of the die carrier 402 and configured to eject the semiconductor die 204 beyond adjacent semiconductor dies in the die carrier 402 to facilitate contact of the bonding head 112 and the semiconductor die 204. The die ejector 404 may be an ejector pin assembly or the like.

Figure 4C:
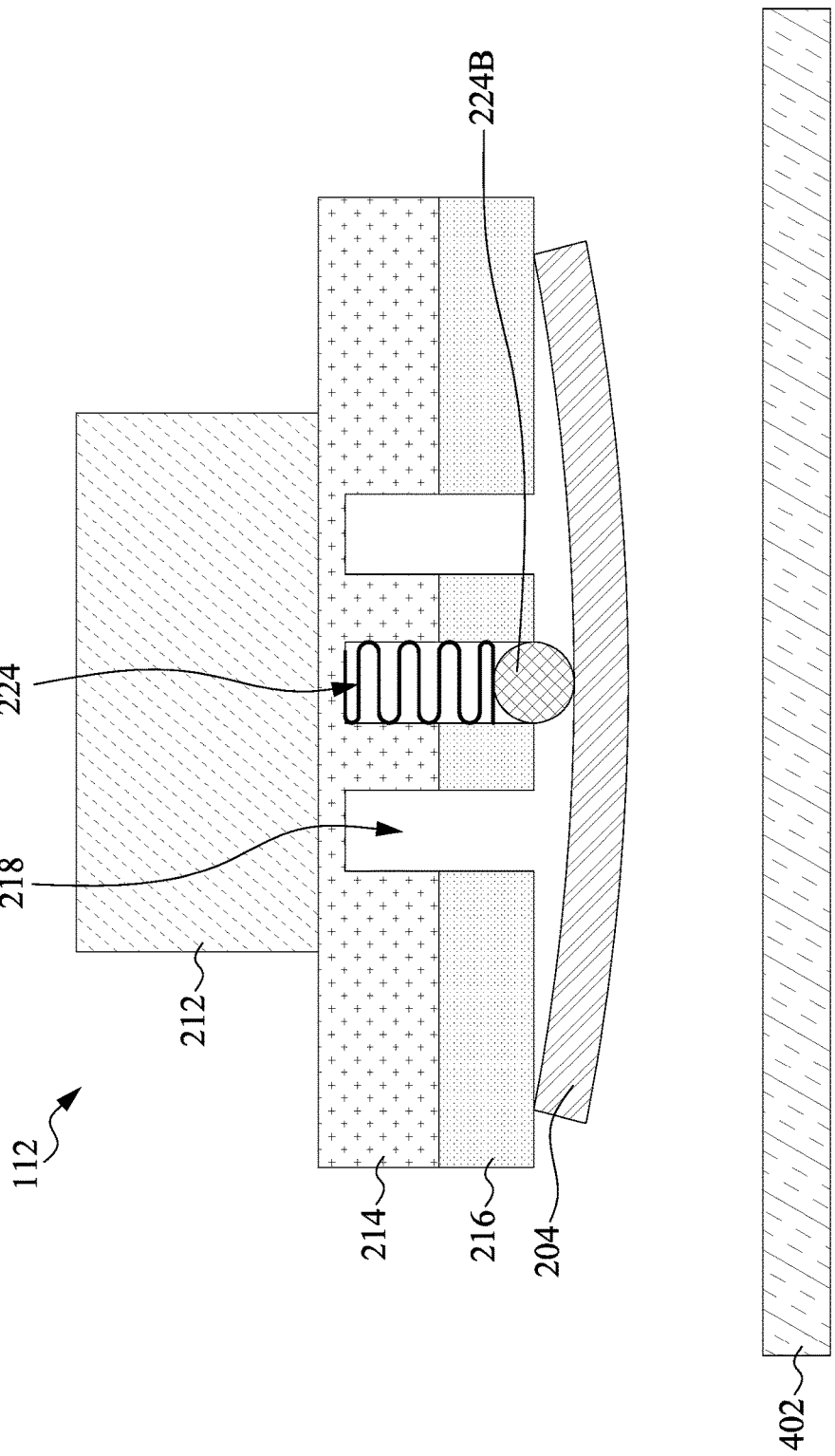

Referring to FIG. 4C, the semiconductor die 204 is moved up, e.g., by the shaft 104 and the arm 102 of the bonding tool 100, and transported to a second bonding chamber 420. In some embodiments, during transport of the semiconductor die 204, the semiconductor die 204 is kept deflected or deformed, and the curvature of the semiconductor die 204 is kept unchanged due to the suction force of the vacuum holes 218 or the protruding force of the bending member 224.

Figure 4D:
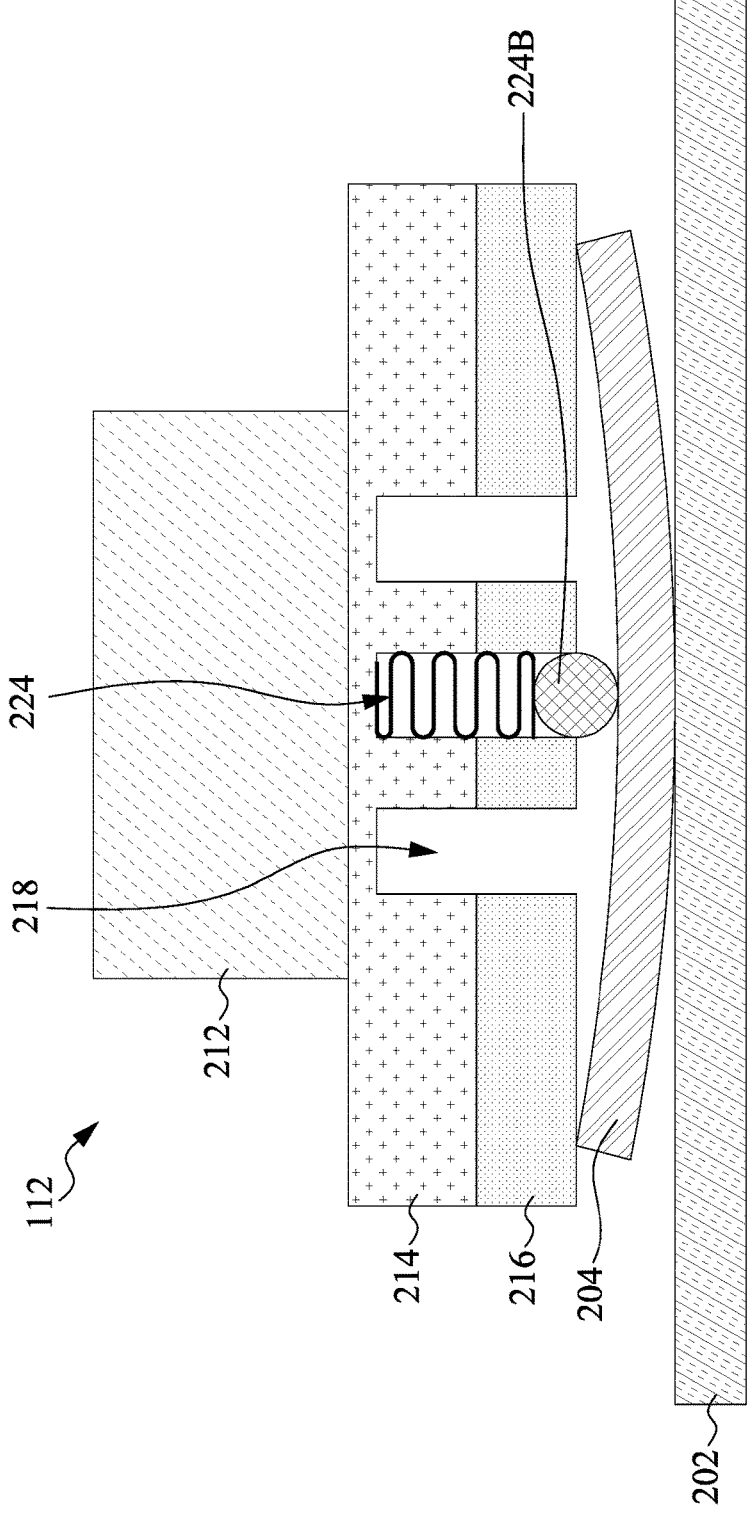
Figure 4D:

FIG. 4D illustrates the transport of the semiconductor die 204 to a second bonding chamber 420 where the semiconductor wafer 202 is placed. In some embodiments, the bonding chambers 410 and 420 are arranged in the same bonding tool 100, or the bonding chamber 420 is another bonding tool. The picked semiconductor die 204 is moved, e.g., by the arm 102, to align with a predetermined location of the semiconductor wafer 202 where a semiconductor device is located. The semiconductor die 204 is moved down toward the semiconductor wafer 202 by a downforce, e.g., provided by the shaft 104 and the arm 102 of the bonding tool 100.

Figure 4E:
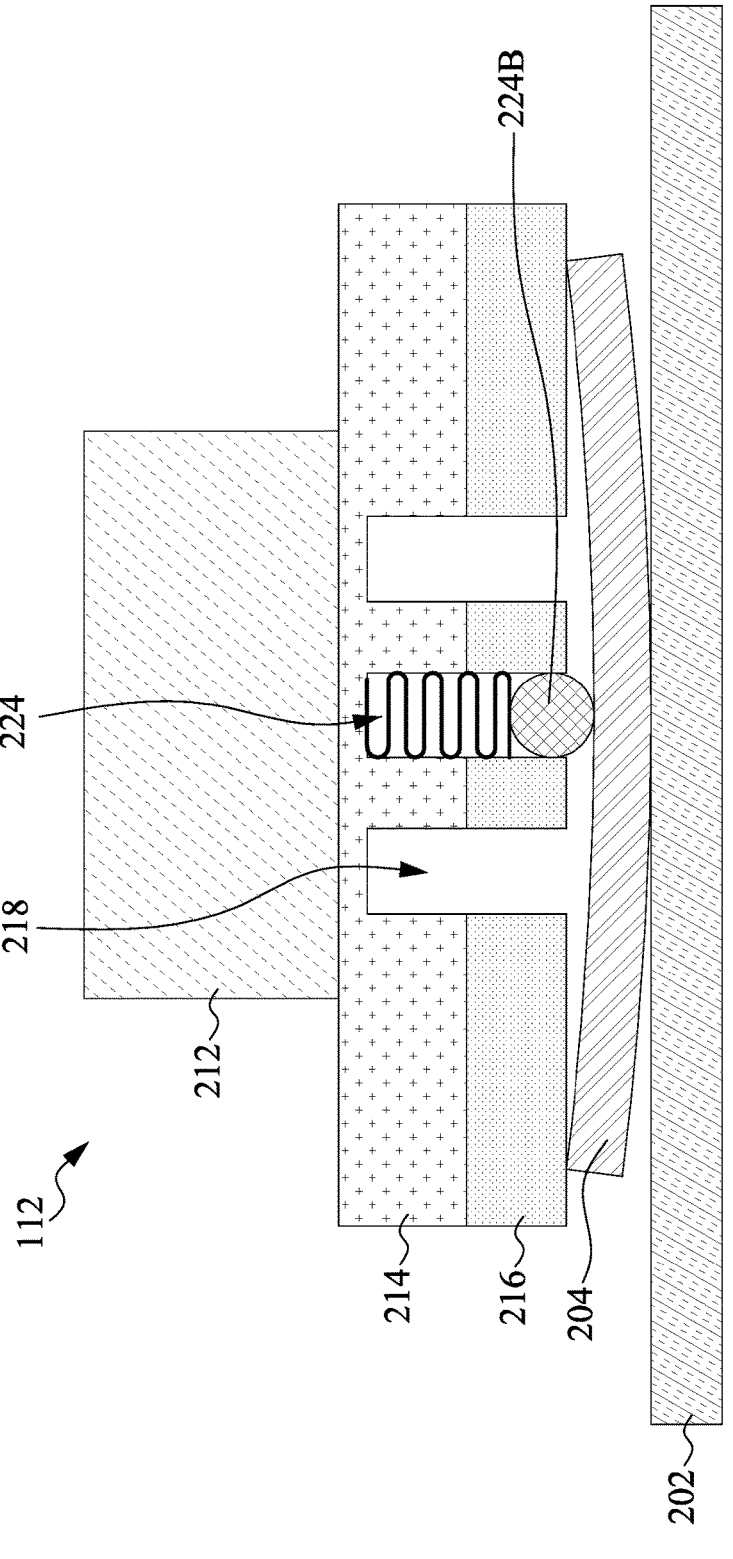

Referring to FIG. 4E, when the semiconductor die 204 is moved forward the semiconductor wafer 202, the central region of the semiconductor die 204 engages the semiconductor wafer 202 while keeping the peripheral region of the semiconductor die 204 apart from the semiconductor wafer 202. The partial bonding between the semiconductor die 204 and the semiconductor wafer 202 starts accordingly. The arm 102 or the shaft 104 continues to exert the downforce to the semiconductor die 204 so that the curvature of the semiconductor die 204 is decreased during the partial bonding. The contact area of the semiconductor die 204 with the semiconductor wafer 202 increases progressively from the central region to the peripheral region of the bonding interface between the semiconductor die 204 and the semiconductor wafer 202. This may aid in reduce the likelihood of air void or gap left in the bonding interface. In some embodiments, the bending member 224 is retracted by the reaction force exerted by the semiconductor die 204. In some embodiments, the body 224B is compressed or contracted by the compression force of the spring 224A and the semiconductor die 204.

Figure 4F:
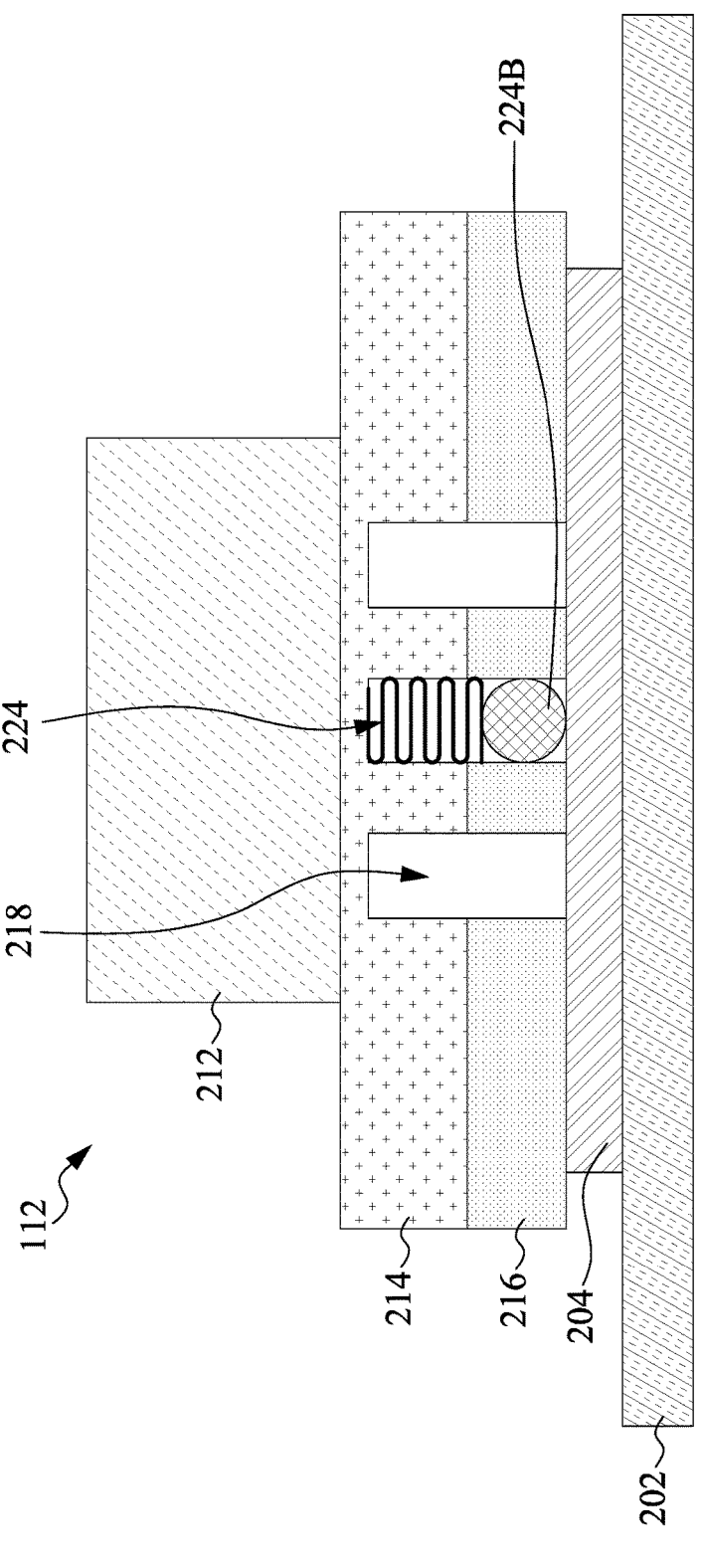

Referring to FIG. 4F, the partial bonding lasts until the entire bonding surface of the semiconductor die 204 contacts the semiconductor wafer 202 to cause a full bonding between the semiconductor die 204 and the semiconductor wafer 202. The semiconductor die 204 becomes substantially flat and in full contact with the semiconductor wafer 202. In some embodiments, the bending member 224 fully retracts into the trench 222, and the bottom point of the bending member 224 (or the body 224B) is level with the bottom surface of the heating plate 216.

In some embodiments, a thermal operation is performed on the bonded semiconductor device formed by the semiconductor wafer 202 and the semiconductor die 204. The thermal operation may be performed for heating the bonding interface through the heating plate 216 at a temperature between about 500° C. and about 1100° C. The thermal operation may be performed for a period between about 20 seconds and about 40 seconds. In some embodiments, the bonding surfaces of the semiconductor die 204 or the semiconductor device of the semiconductor wafer 202 include one of silicon oxide or metallic materials (e.g., Cu), or both. The thermal operation may help formation of the oxide bonds or metallic bonds between the bonding interface during the fusion bonding or hybrid bonding. In some embodiments, a cooling operation is performed to cool down the bonded semiconductor device after the thermal operation.

Figure 4G:
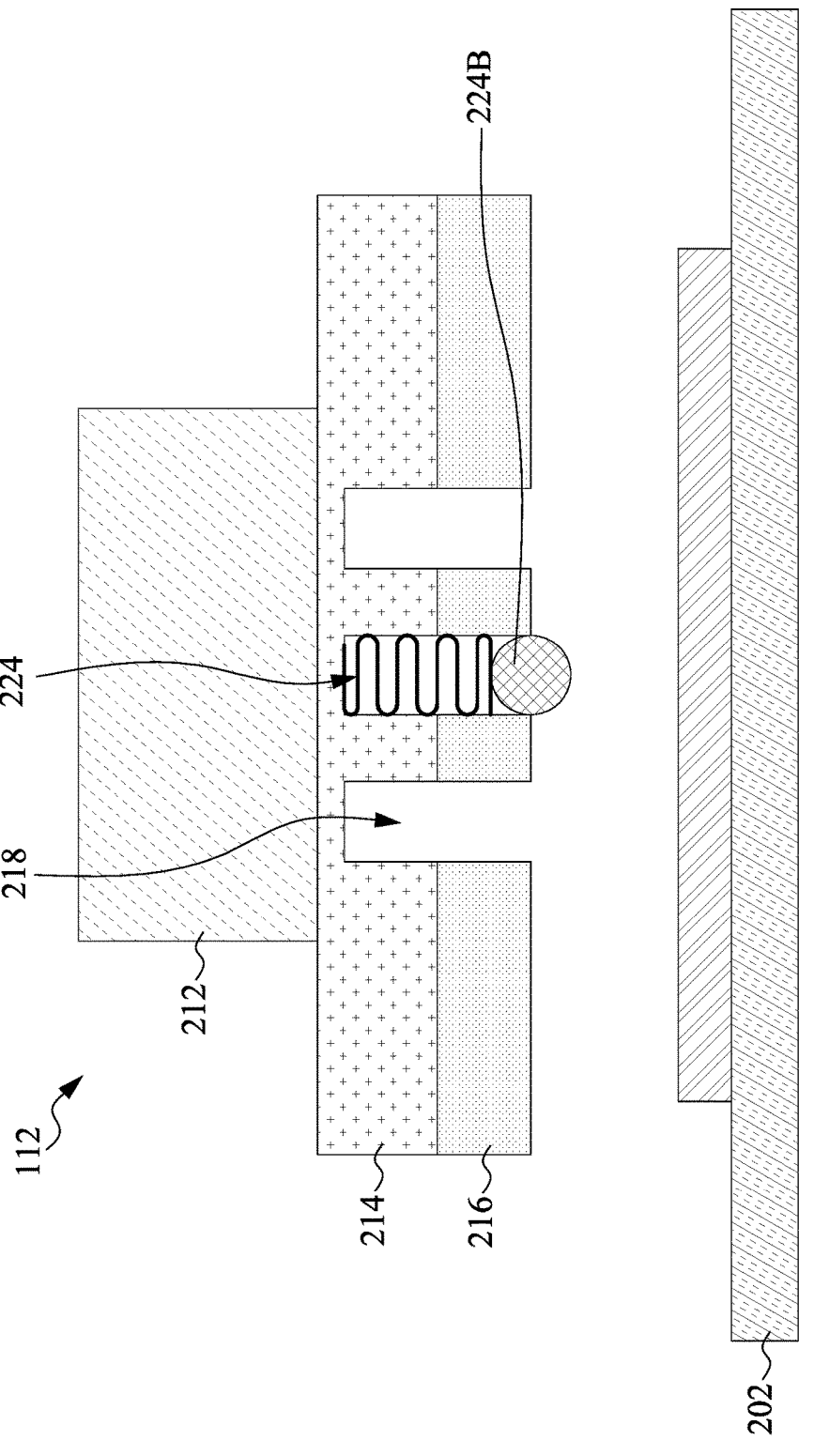

Referring to FIG. 4G, after the thermal operation and the cooling operation are completed, the bonding head 112 releases the semiconductor die 204 or the bonded semiconductor device and moved up. The pumping device 142 may reduce or stop the pumping power to lower the suction force. In some embodiments, the bonding head 112 is retracted or rotated away from the location for the working bonding head. As a result, the PnP bonding operation is completed. In some embodiments, the bending member 224 protrudes beyond the bottom surface of the heating plate 216 due to the spring force of the spring 224A.

FIGS. 5A to 5E are schematic diagrams of intermediate stages of a bonding method, according to aspects of one or more embodiments of the present disclosure. It shall be understood that additional steps can be provided before, during, and after the steps shown in FIGS. 5A to 5E, and some of the steps described below can be replaced with other embodiments or eliminated. The order of the steps may be interchangeable. Some of the steps may be performed concurrently or independently.

Figure 5A:
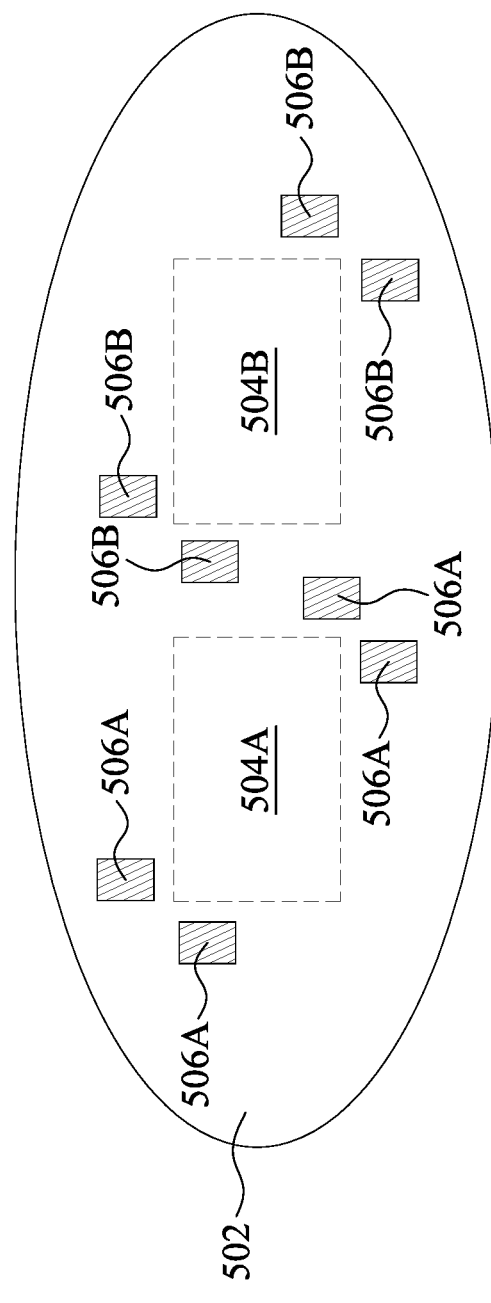
FIGS. 5A to 5E are schematic diagrams of intermediate stages of a bonding method, according to aspects of one or more embodiments of the present disclosure.

Referring to FIG. 5A, a semiconductor wafer 502 is received or provided. A plurality of semiconductor devices 504, e.g., 504A, 504B, are formed on the semiconductor wafer 502. The semiconductor devices 504 may be arranged in an array. Each of the semiconductor devices 504 includes one or more of a transistor, a capacitor, an inductor, a resistor, or the like. In some embodiments, one or more alignment marks 506 for each semiconductor device 504 are formed around the respective semiconductor devices 504. In some embodiments, the alignment mark 506 includes a strip shape, a cross shape, a T-shape, a ring shape, a polygonal shape, or the like. In some embodiments, the alignment marks 506 are formed around the corners of the respective semiconductor devices 504.

In some embodiments, a plurality of first semiconductor dies 510 (e.g., 510A or 510B, see numeral 510A shown in FIG. 5B or 5C) and a plurality of second semiconductor dies 512 (e.g., 512A or 512A, see numeral 512A shown in FIG. 5D or 5E) are formed. As an exemplary formation process, the first semiconductor dies 510 or second semiconductor dies 512 are manufactured on a semiconductor wafer. A dicing or die sawing operation is performed on the semiconductor wafer to form the discrete first semiconductor dies 510 or second semiconductor dies 512. The separated semiconductor dies 510 or 512 may be prepared and arranged in an array. In some embodiments, separated semiconductor dies 510 or 512 are placed on a die carrier. In some embodiments, the die carrier includes a tape for attachment of the semiconductor dies 510 or 512.

Figure 5B:
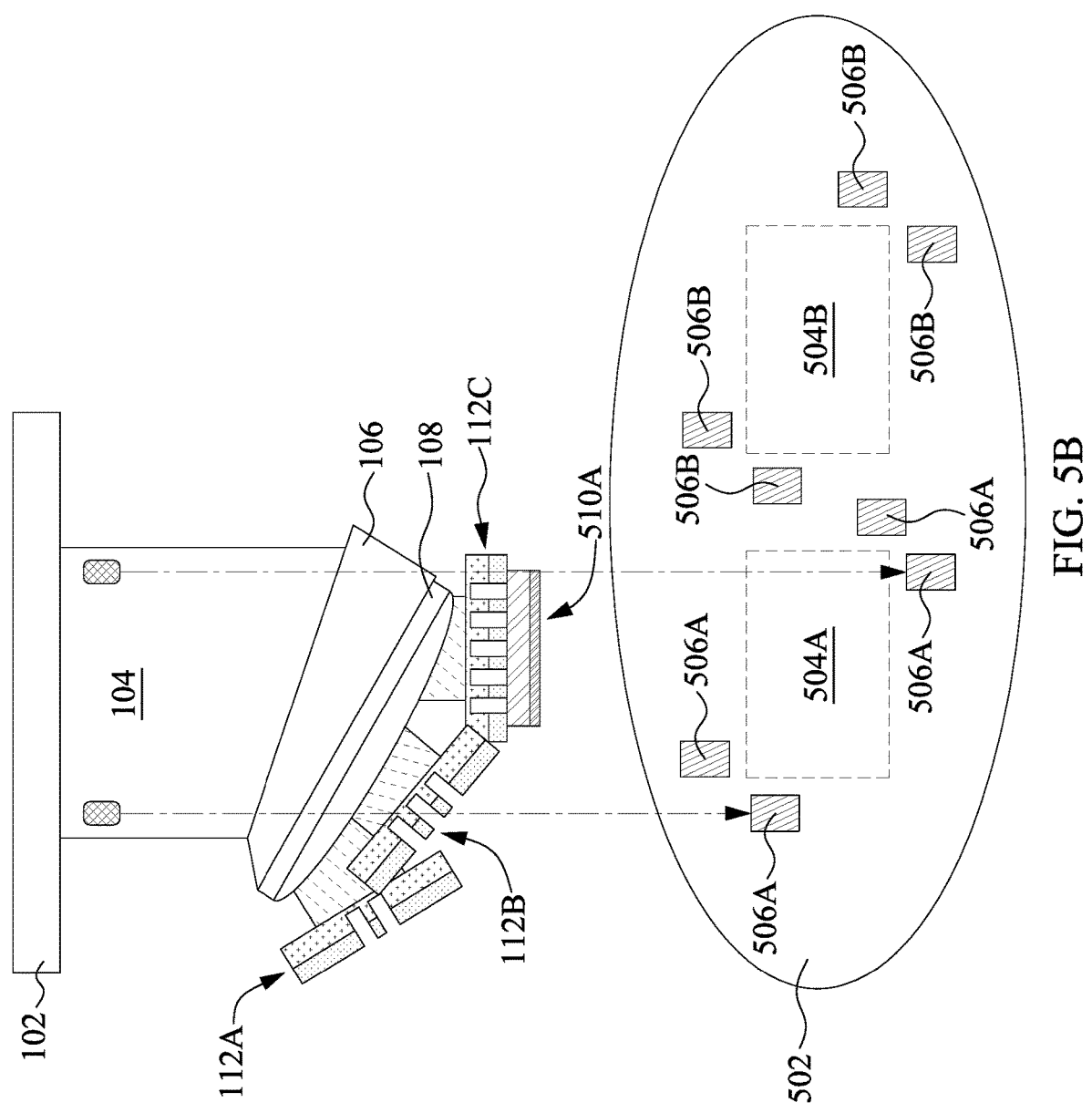

Referring to FIG. 5B, a PnP bonding operation is performed to bond the first semiconductor dies 510 and the second semiconductor dies 512 to the corresponding semiconductor devices 504 to thereby form a plurality of bonded semiconductor devices. In some embodiments, the semiconductor dies 510 and 512 are in different shapes and sizes. In some embodiments, before the PnP bonding operation, a die cleaning operation is performed on the semiconductor dies 510 and 512. The die cleaning operation may be performed using deionized water to remove contaminants or particles on the bonding surfaces of the semiconductor dies 510, 512, or using an alkaline solution to treat the surfaces of the bonding surfaces of the semiconductor dies 510, 512 for facilitating bonding. Before the bonding operation is conducted, a set of suitable bonding heads, e.g., bonding heads 112A and 112C are selected and installed on the platform 308, in which the bonding heads 112A and 112C are selected according to the types of the semiconductor dies 512 and 510, respectively.

Figure 5C:
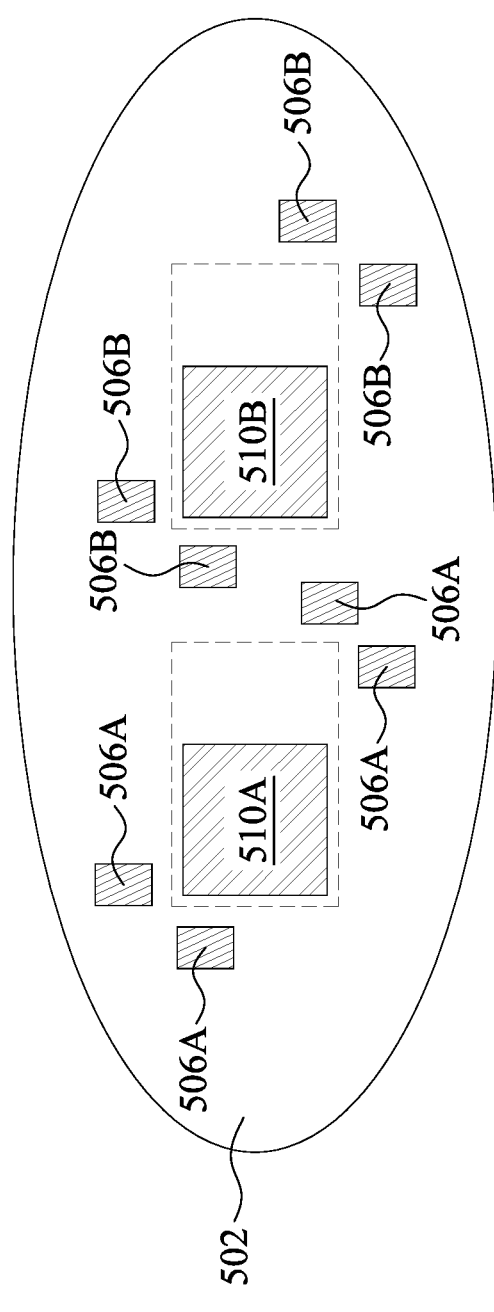

In some embodiments, an alignment and calibration operation is performed to ensure the installed bonding heads 112A and 1120 comply with the alignment requirements between the platform 108, 308 and the bonding heads 112, and between the platform 108, 308 and the connecting member 106. In some embodiments, an alignment operation is performed using the alignment device 138 after the bonding head 1120 has been rotated to the desired location. During operation, each of the first semiconductor dies 510 are bonded to the corresponding semiconductor devices 504 by the bonding head 112C. In some embodiments, referring to FIGS. 4C to 4G, after the semiconductor die 510A has been picked from the die carrier and moved to the location over the semiconductor device 504A, an alignment operation is performed for the semiconductor die 510A using the alignment device 140 and the alignment marks 506A, The same PnP bonding operation is repeated throughout the remaining semiconductor dies 510, e.g., semiconductor die 510B until all of the semiconductor dies 510 are bonded to the corresponding semiconductor devices 504, as illustrated in FIG. 5C.

Figure 5D:
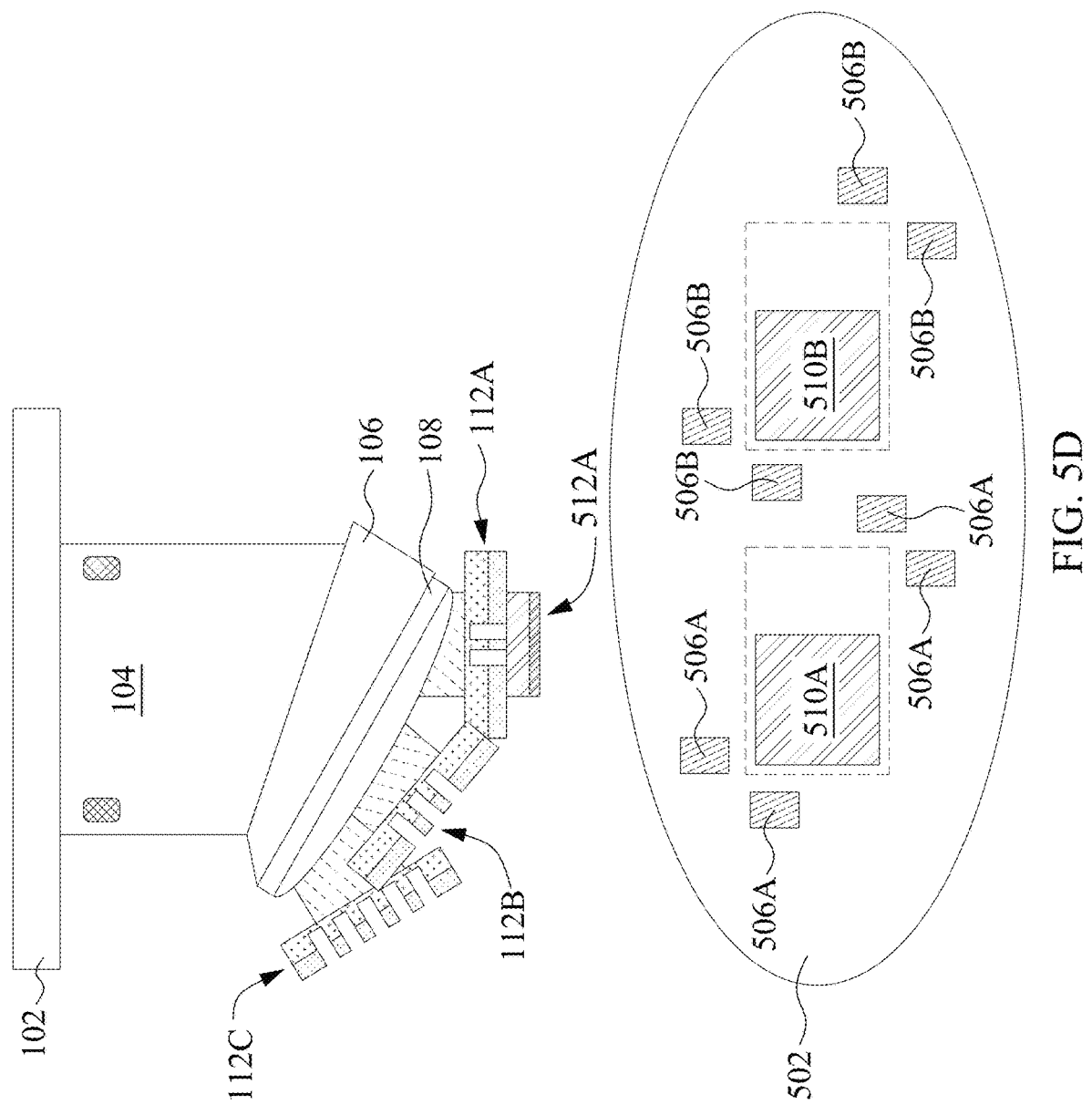
Figure 5E:
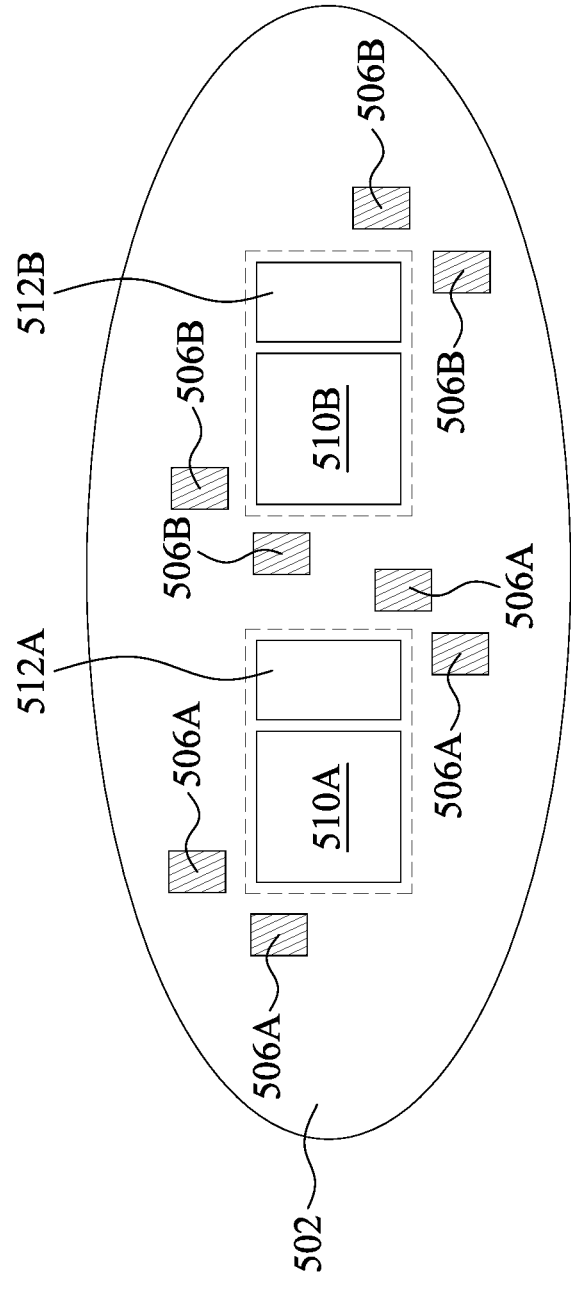

Referring to FIG. 5D, the platform 108 is rotated to select the bonding head 112A for sucking the semiconductor dies 512. In some embodiments, an alignment operation is performed using the alignment device 138 after the bonding head 112A has been moved to the desired location. During operation, each of the second semiconductor dies 512 are bonded to the corresponding semiconductor devices 504 by the bonding head 112A, where the details of the bonding method refers to the PnP bonding method with reference to FIGS. 4A to 4G. In some embodiments, after the semiconductor die 512A has been picked from the die carrier and moved to the location over the semiconductor device 504A, an alignment operation is performed for the semiconductor die 512A using the alignment device 140 and the alignment marks 506A. The detailed bonding operation is discussed with reference to FIGS. 4A to 4G and is not repeated for simplicity. The same PnP bonding operation is repeated for the remaining second semiconductor dies 512, e.g., semiconductor die 512B until all of the second semiconductor dies 512 are bonded to the corresponding semiconductor devices 504, as illustrated in FIG. 5E.

In some embodiments, the first semiconductor dies 510 and the second semiconductor dies 512 are bonded to the same surface of the semiconductor wafer 502. In some other embodiments, the bonded semiconductor device can be formed by bonding more than two semiconductor dies, or can be formed by different bonding architectures, e.g., the second semiconductor dies 512 are bonded to the respective first semiconductor dies 510.

The proposed multi-head bonding tool and bonding method provide advantages. Existing bonding method may perform the multi-die bonding by manual replacement of the bonding heads each time the different semiconductor dies have different types, e.g., different dimensions, areas, sizes, shapes and the like. The calibration steps and manual replacement routine would takes a great amount of processing time and increase the likelihood of contamination. In contrast, the proposed scheme can perform multi-die bonding without manual replacement of the bonding heads, and therefore the processing time and cost can be effectively improved.

FIG. 6 is a flowchart of a bonding method 600, according to aspects of one or more embodiments of the present disclosure. It shall be understood that additional steps can be provided before, during, and after the steps shown in FIG. 6, and some of the steps described below can be replaced with other embodiments or eliminated. The order of the steps may be interchangeable. Some of the steps may be performed concurrently or independently.

At step 602, a first semiconductor die and a second semiconductor die are formed for a bonded semiconductor device. In some embodiments, the first semiconductor die and the second semiconductor die have different types, e.g., different shapes, different sizes, different areas, and the like.

At step 604, a bonding tool is configured based on the first and second semiconductor dies. In some embodiments, the bonding tool is configured to perform hybrid bonding or fusion bonding. The bonding tool may include a platform and may be configured to select and install a first bonding head and a second bonding head on the platform according to the types of the first and second semiconductor dies, respectively.

At step 606, the first bonding head is selected as a working bonding head.

At step 608, the first semiconductor die is attached to the first bonding head and moved to a location over a semiconductor wafer arranged on a stage.

At step 610, the first semiconductor die is moved toward the semiconductor wafer to be bonded to the semiconductor wafer.

At step 612, the second bonding head is selected as the working bonding head.

At step 614, the platform or the bonding tool is configured to cause the second bonding head to move the second semiconductor die to the location over the semiconductor wafer while keeping the first bonding head on the platform.

At step 616, the second semiconductor die is moved by the second bonding head toward the semiconductor wafer to be bonded to the semiconductor wafer to thereby complete the bonding operation.

In accordance with some embodiments of the present disclosure, a method is provided. The method includes configuring a bonding tool based on a first semiconductor die and a second semiconductor die, wherein the bonding tool includes a platform and a first bonding head and a second bonding head connected to the platform; attaching the first semiconductor die to the first bonding head and moving the first semiconductor die to a location over a semiconductor wafer arranged on a stage; moving the first semiconductor die toward the semiconductor wafer to bond the first semiconductor die to the semiconductor wafer through fusion bonding or hybrid bonding; releasing the first semiconductor die from the first bonding head; configuring the platform to cause the second bonding head to move the second semiconductor die to the location over the semiconductor wafer while keeping the first bonding head on the platform; and moving the second semiconductor die by the second bonding head toward the semiconductor wafer to bond the second semiconductor die to the semiconductor wafer through fusion bonding or hybrid bonding.

In accordance with some embodiments of the present disclosure, a method is provided. The method includes forming a first semiconductor die and a second semiconductor die for a bonded semiconductor device, the first and second semiconductor dies have different sizes; configuring a bonding tool, wherein the bonding tool includes a platform, and a first bonding head and a second bonding head connected to the platform, wherein the first and second bonding heads have different suction configurations; selecting the first bonding head as a working bonding head; picking the first semiconductor die by the first bonding head and bonding the first semiconductor die to a semiconductor wafer; selecting the second bonding head as the working bonding head; and picking the second semiconductor die by the second bonding head and bonding the second semiconductor die to the semiconductor wafer to thereby form the bonded semiconductor device.

In accordance with some embodiments of the present disclosure, a bonding tool is provided. The bonding tool includes a shaft extending in a vertical direction, a platform rotatably connected to the shaft, the platform includes at least two detachable bonding heads, and a processor configured to control the shaft and the platform. Each of the at least two detachable bonding heads includes a plurality of vacuum holes configured to suck a semiconductor die, wherein each of the at least two bonding heads are different from each other in their respective bonding head sizes and vacuum hole configurations.

The foregoing outlines structures of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
configuring a bonding tool based on a first semiconductor die and a second semiconductor die, wherein the bonding tool comprises a platform and a first bonding head and a second bonding head connected to the platform;
attaching the first semiconductor die to the first bonding head and moving the first semiconductor die to a location over a semiconductor wafer arranged on a stage;
moving the first semiconductor die toward the semiconductor wafer to bond the first semiconductor die to the semiconductor wafer through a fusion bonding or a hybrid bonding;
releasing the first semiconductor die from the first bonding head;
configuring the platform to cause the second bonding head to move the second semiconductor die to the location over the semiconductor wafer while keeping the first bonding head on the platform; and
moving the second semiconductor die by the second bonding head toward the semiconductor wafer to bond the second semiconductor die to the semiconductor wafer through the fusion bonding or the hybrid bonding,
wherein the first bonding head comprises first vacuum holes configured to suck the first semiconductor die, wherein the second bonding head comprises second vacuum holes configured to suck the second semiconductor die, wherein a number of the first vacuum holes is different from that of the second vacuum holes.

2. The method of claim 1, wherein each of the first bonding head and the second bonding head comprises an air channel configured to pump air from the first vacuum holes or the second vacuum holes.

3. The method of claim 1, wherein the configuring of the first and second bonding heads is performed based on a shape or an area of each of the first and second semiconductor dies.

4. The method of claim 1, wherein the first vacuum holes or the second vacuum holes include a circular shape, a rectangular shape or a ring shape from a top-view perspective.

5. The method of claim 1, wherein at least one of the first vacuum holes or the second vacuum holes has a circular shape or a strip shape from a bottom-view perspective.

6. The method of claim 1, wherein the first bonding head includes a central region and a peripheral region, wherein a first group of the first vacuum holes in the central region have a first width, measured from a cross-sectional view, different from a second width of a second group of the first vacuum holes in the peripheral region.

7. The method of claim 1, wherein the first vacuum holes have a first pitch in a central region of the first bonding head different than a second pitch of the vacuum holes in a peripheral region of the first bonding head.

8. The method of claim 1, wherein the configuring of the platform further comprises causing a lower surface of the first bonding head lower than a lower surface of the second bonding head before attaching the first semiconductor die to the first bonding head.

9. The method of claim 1, wherein the platform comprises a revolving nosepiece, wherein the configuring of the platform comprises rotating the revolving nosepiece to cause the first or second bonding head to face the semiconductor wafer.

10. The method of claim 1, wherein the configuring of the platform comprises causing a longitudinal axis of the first or second bonding head to be parallel to a longitudinal axis of a shaft of the bonding tool.

11. The method of claim 1, wherein the platform comprises a turntable configured to rotate the first and second bonding heads at a same level during the rotation of the platform.

12. The method of claim 1, wherein each of the first and second bonding heads comprises a bending member configured to bend the first or second semiconductor die when attaching the first or second semiconductor die to the first or second bonding head.

13. A method, comprising:
forming a first semiconductor die and a second semiconductor die for a bonded semiconductor device, the first and second semiconductor dies have different sizes;
configuring a bonding tool, wherein the bonding tool comprises a platform, and a first bonding head and a second bonding head connected to the platform, wherein the first and second bonding heads have different suction configurations;
selecting the first bonding head as a working bonding head;
picking the first semiconductor die by the first bonding head and bonding the first semiconductor die to a semiconductor wafer;
selecting the second bonding head as the working bonding head; and
picking the second semiconductor die by the second bonding head and bonding the second semiconductor die to the semiconductor wafer to thereby form the bonded semiconductor device,
wherein the first bonding head and the second bonding head have different suction forces.

14. The method of claim 13, wherein the platform comprises a turntable configured to rotate the first and second bonding heads at a same level during the rotation of the platform.

15. The method of claim 13, wherein the platform comprises a first socket and a second socket, wherein each of the first and second bonding heads comprises a lifting device in the first or second socket and configured to lift the respective first or second bonding head in a vertical direction.

16. The method of claim 13, wherein each of the first and second bonding heads are configured to conduct a fusion bonding or a hybrid bonding.

17. The method of claim 13, wherein the first bonding head comprises a first body and a first chuck connected to the first body, the second bonding head comprises a second body and a second chuck connected to the second body, wherein the first body and the second body have substantially equal sizes, and the first chuck and the second chuck have different numbers of vacuum holes.

18. A method, comprising:

providing a bonding tool comprising a platform and a plurality of bonding heads connected to the platform in different connection orientations;

attaching a first semiconductor die to a wafer by a first one of the plurality of bonding heads;

releasing the first semiconductor die from the first one of the plurality of bonding heads; and rotating the platform to cause a second one of the plurality of bonding heads to attach a second semiconductor die to the wafer, wherein each of the first and second bonding heads comprises a bending member configured to bend the first or second semiconductor die when attaching the first or second semiconductor die to the first or second bonding head, respectively.

19. The method of claim 18, wherein each of the plurality of bonding heads is connected to a same lower surface of the platform.

20. The method of claim 18, wherein the platform is configured to position one of the plurality of bonding heads to face directly downward while keeping remaining bonding heads oriented away from the downward direction.

\* \* \* \* \*